United States Patent [19]

Watanabe et al.

[11] Patent Number: 4,995,003

[45] Date of Patent: Feb. 19, 1991

[54] SERIAL DATA TRANSFER CIRCUIT FOR A SEMICONDUCTOR MEMORY DEVICE

[75] Inventors: Yuji Watanabe, Kawasaki; Haruki Toda, Yokohama; Hiroshi Sahara; Shigeo Ohshima, both of Tokyo, Japan

[73] Assignee: Kabushiki Kaisha Toshiba, Kawasaki, Japan

[21] Appl. No.: 289,115

[22] Filed: Dec. 23, 1988

[30] Foreign Application Priority Data

Dec. 26, 1987 [JP] Japan .................. 62-330500

[51] Int. Cl.$^5$ .............................. G11C 7/00
[52] U.S. Cl. .................. 365/189.05; 365/221; 377/77
[58] Field of Search ........... 365/189.05, 230.08, 365/230.05, 219, 221; 377/69, 77, 81

[56] References Cited

U.S. PATENT DOCUMENTS 3,618,033 12/1968 Norquist et al. .................. 377/69
3,781,821 12/1973 Roth ................................. 377/81
4,745,577 5/1988 Ogawa et al. .................... 365/221

FOREIGN PATENT DOCUMENTS 62-143279 6/1987 Japan .

*Primary Examiner*—James W. Moffitt
*Assistant Examiner*—Michael A. Whitfield
*Attorney, Agent, or Firm*—Finnegan, Henderson, Farabow, Garrett, and Dunner

[57] ABSTRACT

A data transfer circuit is connected between first and second circuits so as to control data transfers therebetween. The data transfer circuit comprises first and second latch circuits for latching data in response to first and second latch control signals, respectively, a first data transfer gate connected between the first circuit and the first latch circuit and responsive to a first gate control signal to make electrical connection or disconnection therebetween, a second transfer gate connected between the first and second data latch circuits and responsive to a second gate control signal to make electrical connection or disconnection therebetween, and a third data transfer gate connected between the second data latch circuit and the second circuit and responsive to a third gate control signal to make electrical connection or disconnection therebetween. After data is transferred from the first circuit to the first data latch circuit, the data can be transferred from the data latch circuit to the second data latch circuit even if the data in the data first circuit disappears. The third data transfer gate can be opened to transfer data from the second data latch circuit to the second circuit.

13 Claims, 18 Drawing Sheets

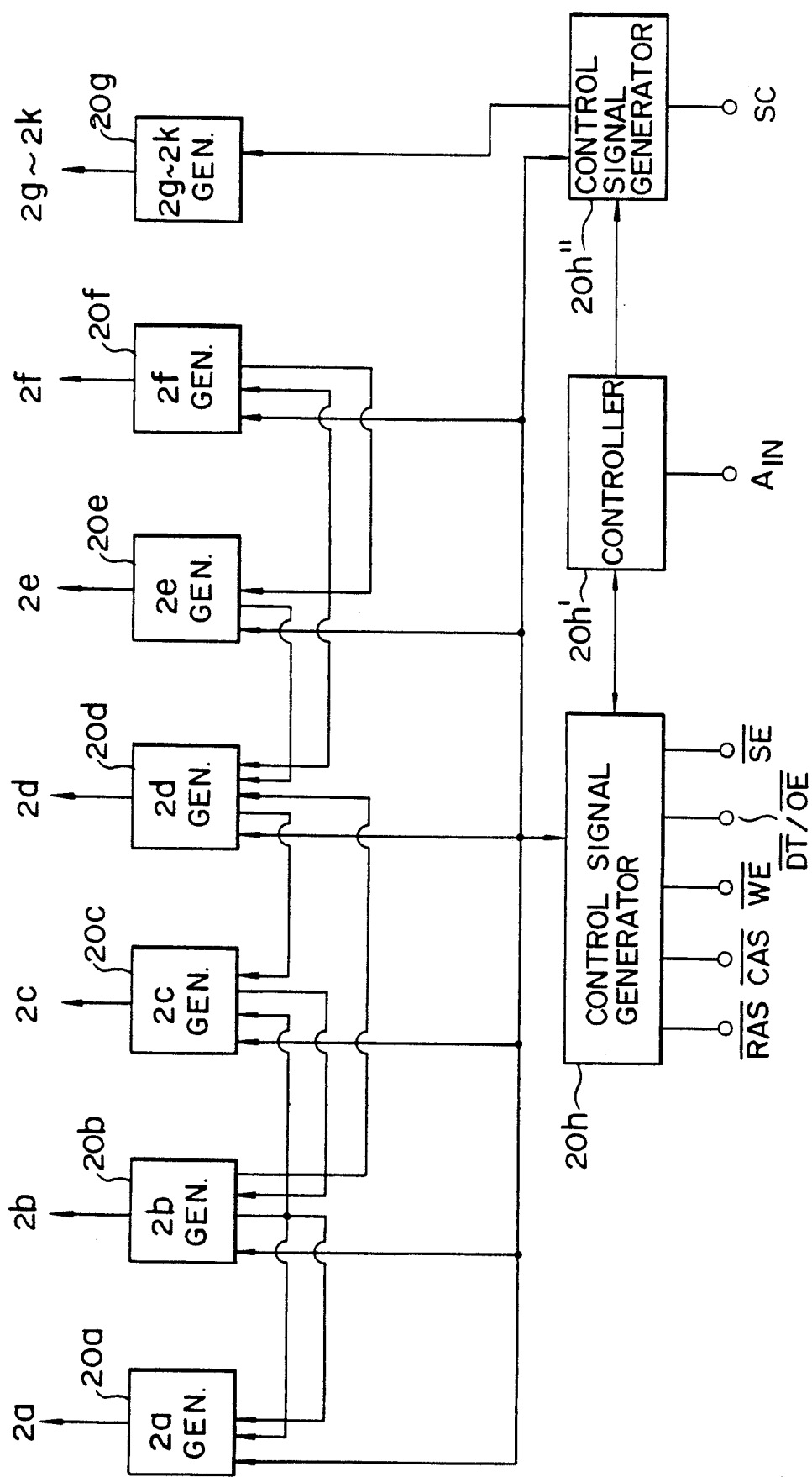
F I G. 3B

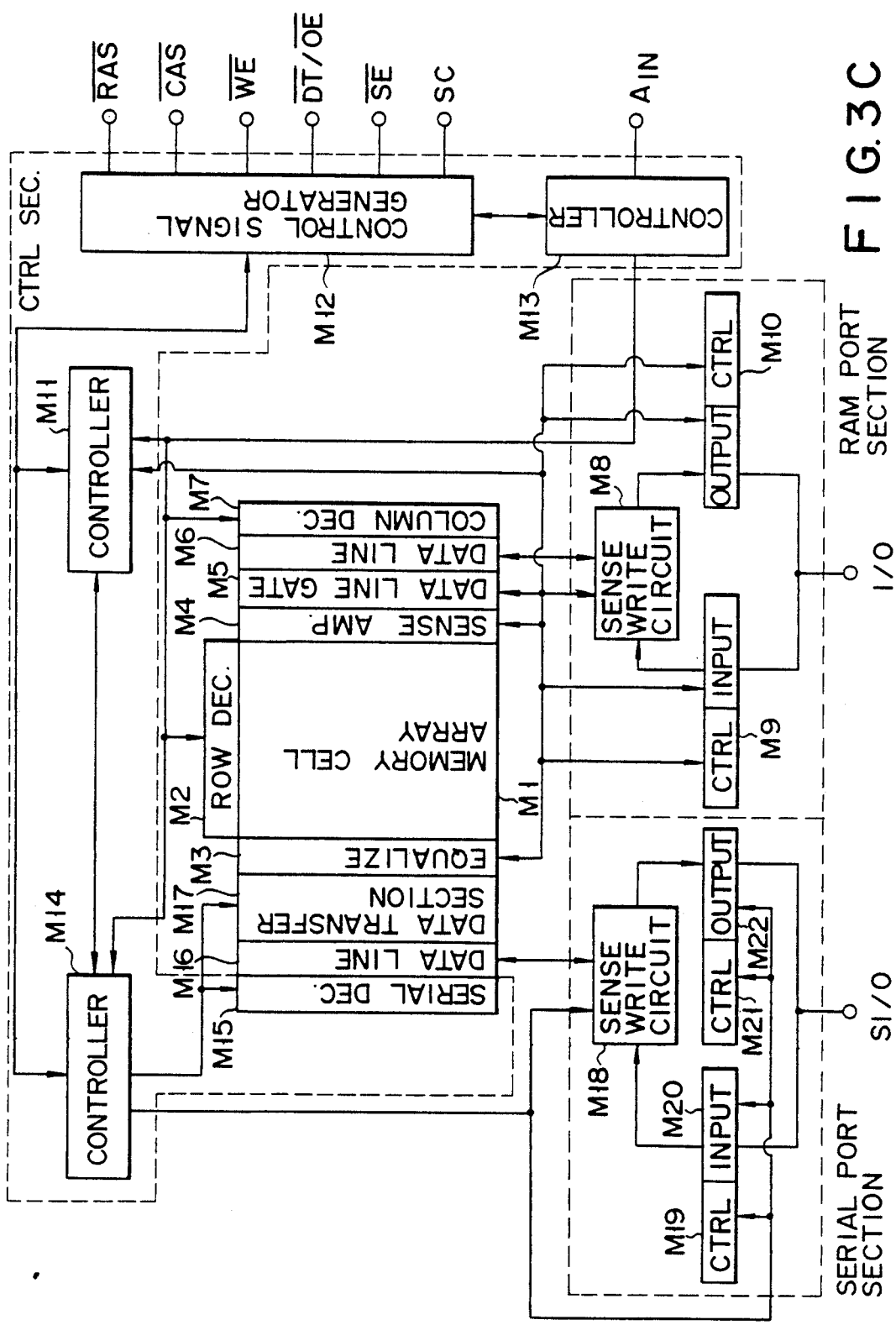

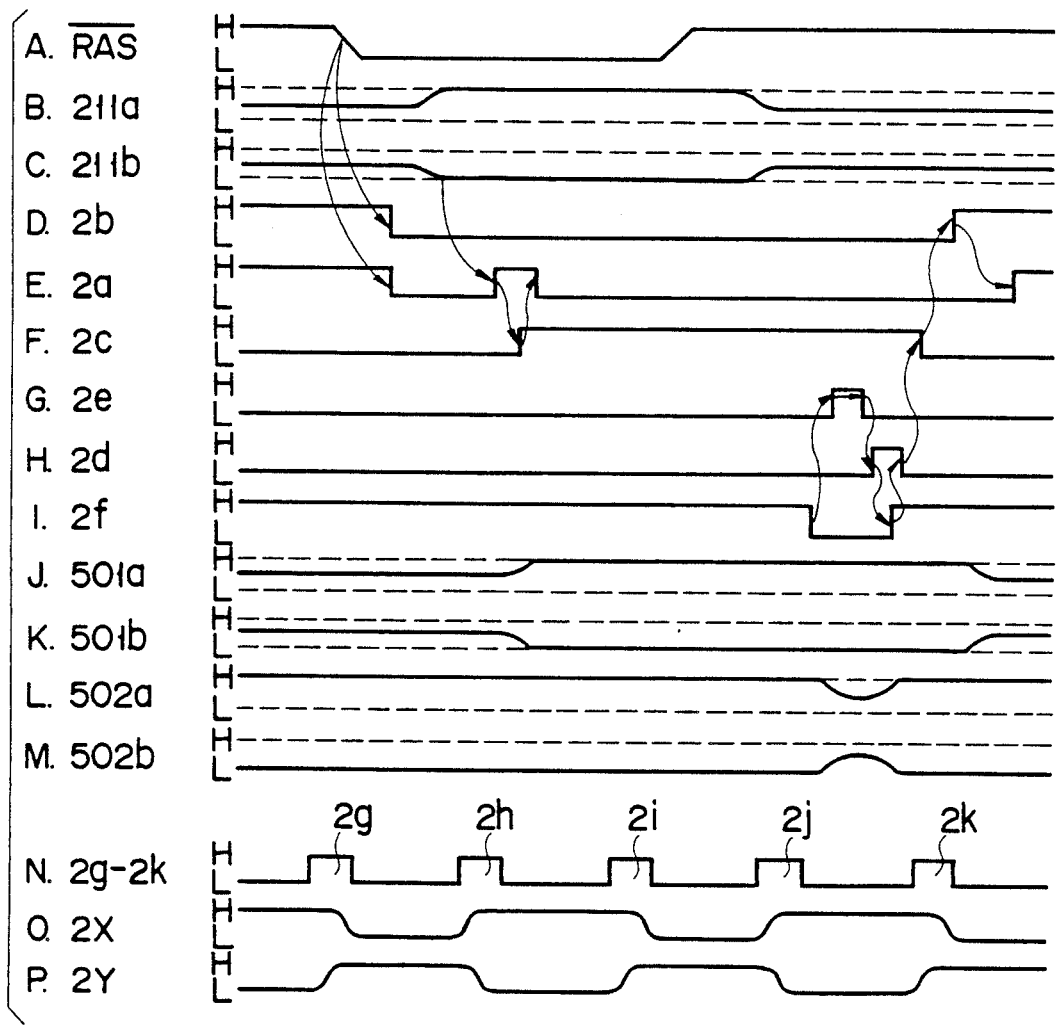
F I G. 4

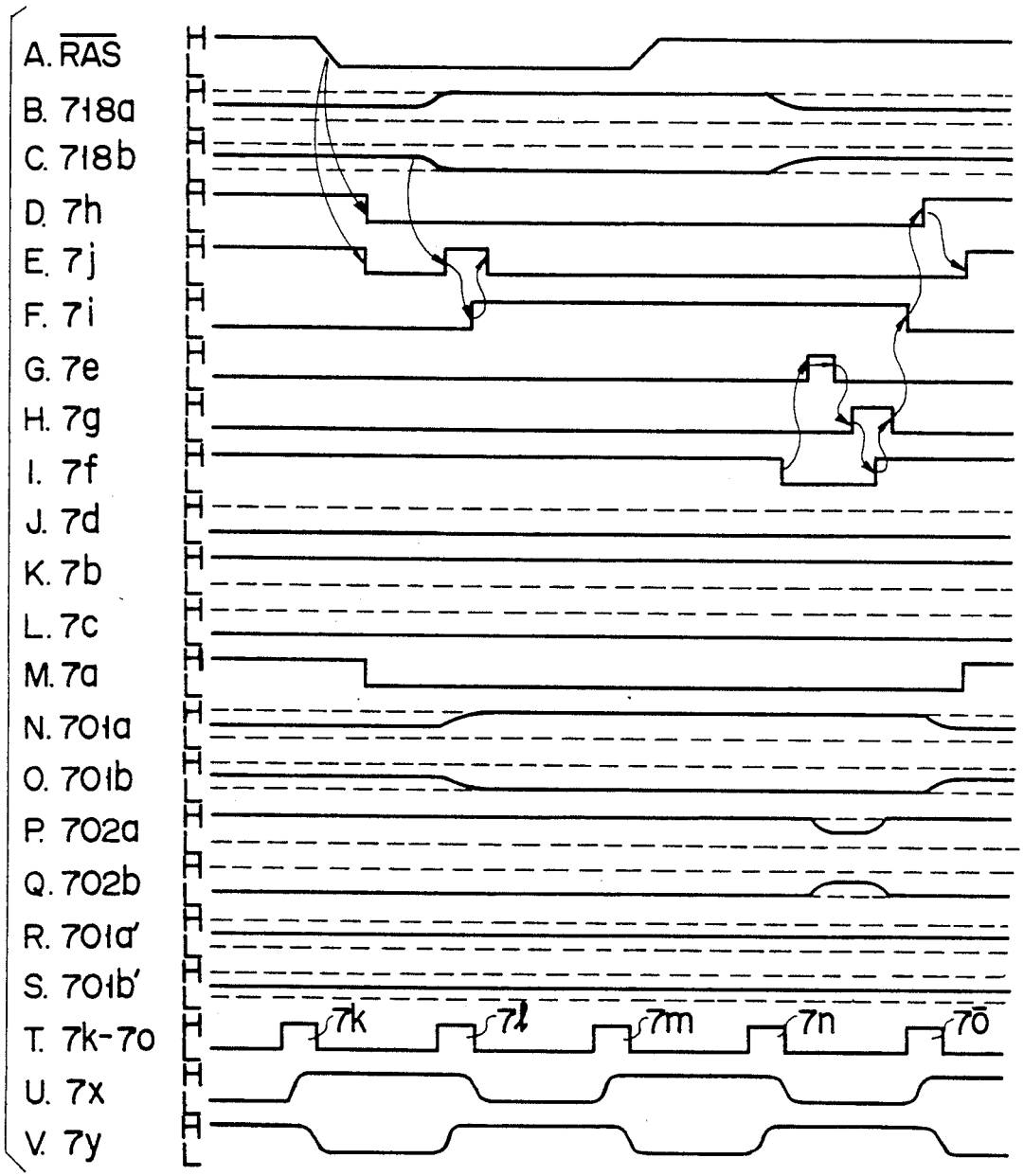
F I G. 7

FIG. 9

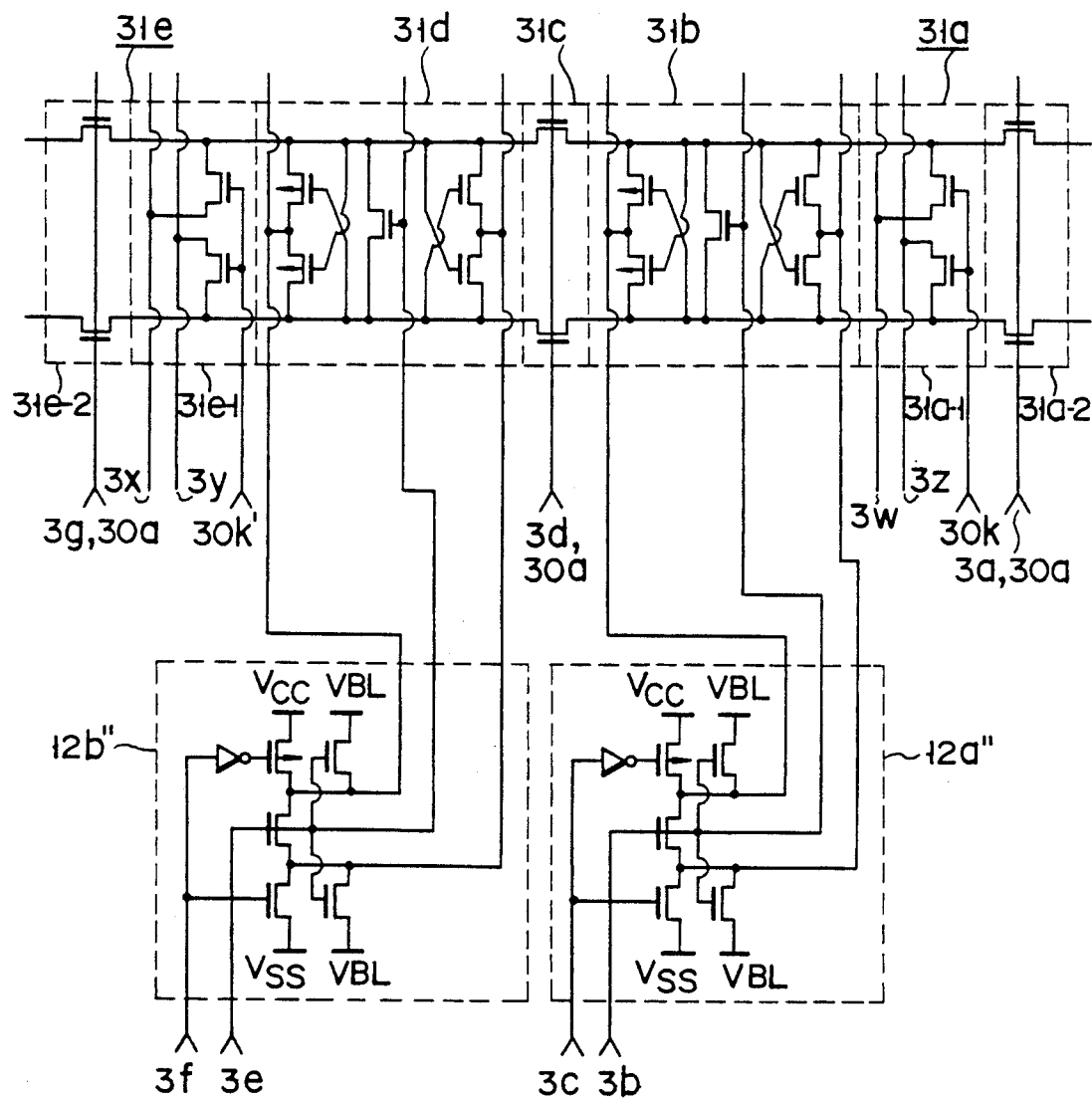
F I G. 10A

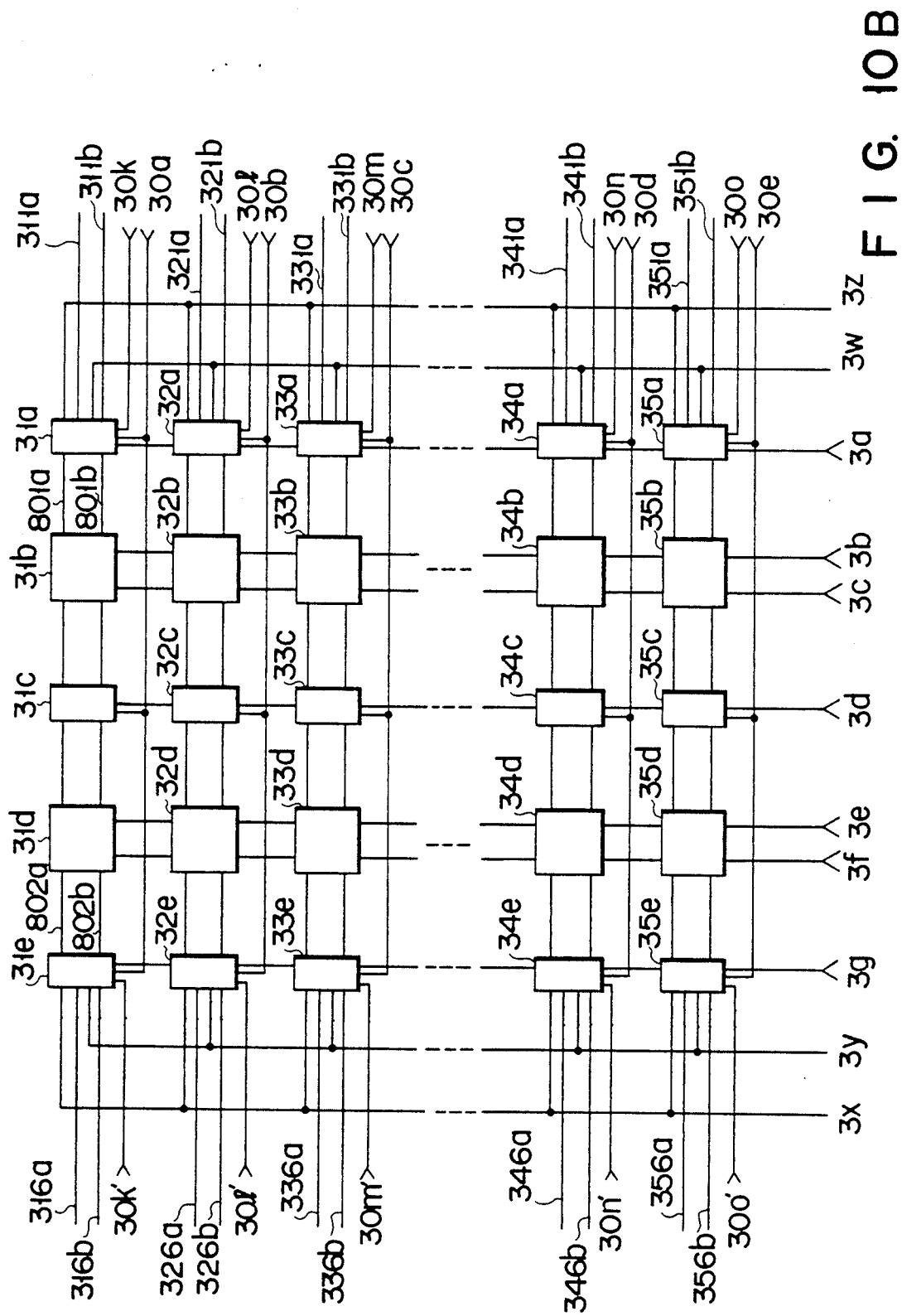

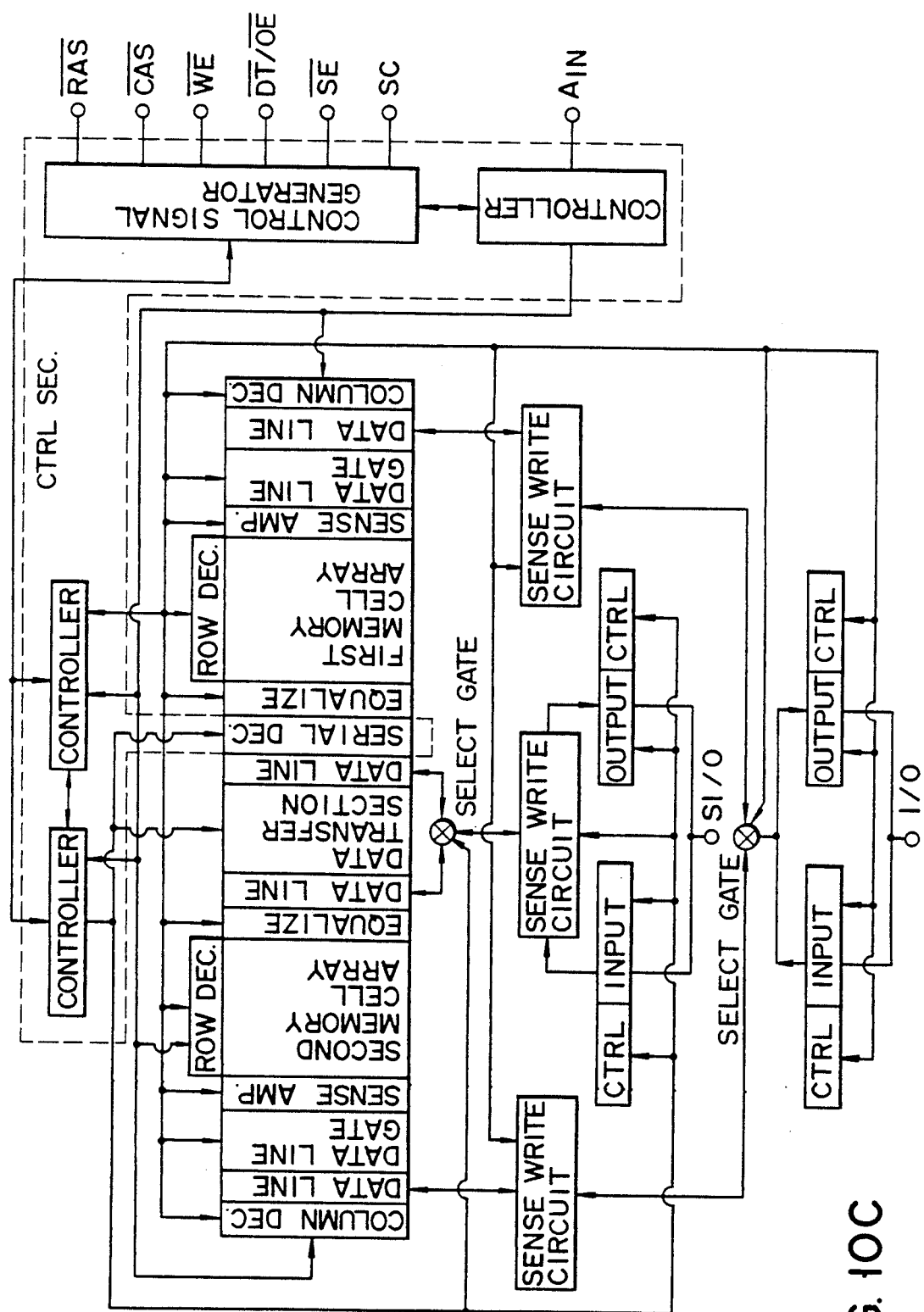
F I G. 10C

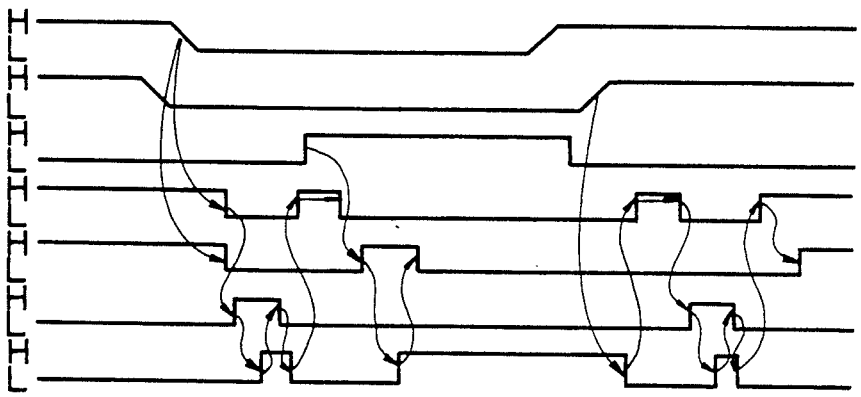
F I G. 13
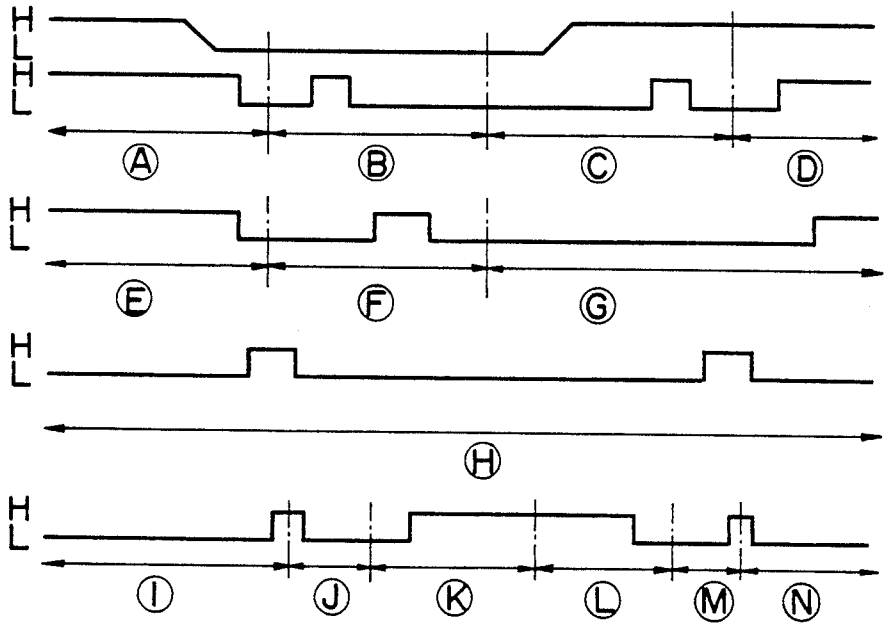
F I G. 14

SERIAL DATA TRANSFER CIRCUIT FOR A SEMICONDUCTOR MEMORY DEVICE

BACKGROUND OF THE INVENTION

1. Field of the Invention

The present invention relates to a data transfer circuit for use in a semiconductor device.

2. Description of the Related Art

As shown FIG. 1, a data transfer section conventionally used in a dual-port memory is arranged between a random-accessed RAM section and, for example, a serial port section. The data transfer section is comprised of a data holding section 101 and two data transfer gate sections 102 and 103. In a read transfer cycle data bits read from the RAM section in bit parallel are first transferred to data holding section 101 via gate section 102. Data holding section 101 is accessed in bit serial so that the data bits are serially output to the serial port section via gate section 103. In a write transfer cycle, serial data bits from the serial port section are written into data holding section 101 via gate section 103. Thereafter, data holding section 101 transfers the data bits in parallel to the RAM section via gate section 102.

With the circuit arrangement of FIG. 1, however, when data bits on bit-line pairs 104a through 104b are transferred to data holding section 101 via data transfer gate section 102, if a row address strobe signal $\overline{RAS}$ goes from a "L" level to a "H" level, the data bits on the bit-line pairs will generally disappear. Thus, the timing for data transfer must be set before the signal $\overline{RAS}$ goes from "L" level to "H" level. For this reason the flexibility of determination of the data transfer timing becomes small, and the data transfer circuit is thus very hard to use.

When the bit lines are made of a material of high resistivity, it takes long to transfer data on the bit lines to data holding section 101 in the read transfer cycle. During this period of time data cannot be transferred from data holding section 101 to the serial port section. It also takes long to transfer data held in data holding section 101 onto the bit lines in a write transfer cycle. Therefore, this kind of data transfer section cannot continuously transfer data from data transfer section to the serial port section and from the serial port section to data transfer section, via gate section 103.

SUMMARY OF THE INVENTION

It is accordingly an object of the present invention to provide a method of transferring data continuously without the limitation on the data transfer timing and a circuit for the same.

A data transfer circuit according to the present invention is arranged between first and second circuits to control data transfers therebetween. The data transfer circuit comprises first and second data latch circuits for latching data in response to input first and second latch control signals, respectively, a first data transfer gate arranged between the first circuit and the first data latch circuit and responsive to an input first gate control signal to make connection or disconnection therebetween, a second transfer gate arranged between the first and second data latch circuits and responsive to an input second gate control signal to make connection or disconnection therebetween, and a third data transfer gate arranged between the second data latch circuit and the second circuit and responsive to an input third gate control signal to make connection or disconnection therebetween.

According to the data transfer circuit of the present invention as described above, if data is transferred from the first circuit to the first data latch circuit during the data transfer from the second data latch circuit to the second circuit, the data from the first circuit can be transferred at any timing from the second data latch circuit to the second circuit even after the data in the first circuit disappears. More specifically, the data has been transferred from the first circuit to the first data latch circuit, and therefore, the data transfer timing when the second data transfer gate must be opened to transfer the data from the first data latch circuit to the second data latch circuit can be set as desired, after the data in the first circuit disappears. Previous data held in the second data latch circuit can be transferred to the second circuit until the data is transferred from the first data latch circuit to the second data latch circuit. Therefore, the timing for switching from the previous data to the data transferred from the first circuit can be set arbitrarily. Also, if the second data transfer gate is closed, the data transfer from the second data latch circuit to the second circuit can be performed continuously even while the data is transferred from the first circuit to the first data latch circuit. As a result, the data transfer timing from the first circuit to the second circuit can be set arbitrarily. In the write transfer cycle, data held by the second data latch circuit can be transferred from the first data latch circuit to the first circuit even while new data is written from the second circuit into the second data latch circuit, if the data held in the second data latch circuit has been transferred to the first data latch circuit. As mentioned above, this data transfer circuit can arbitrarily set the timing of the data transfer and can continuously input or output the data.

BRIEF DESCRIPTION OF THE DRAWINGS

FIG. 3B is a block diagram of a control section used with the first embodiment of the data transfer section;

FIG. 3C is a block diagram of the semiconductor memory to which the data transfer section is applied;

FIGS. 4A through 4P are timing charts showing operations of the first embodiment of the data transfer section during a read transfer cycle·serial read cycle to transfer data from the RAM section connected to bit line pair 211a and 211b to the serial port section connected to data line pair 2x and 2y;

FIGS. 7A through 7V are timing charts showing the operations of the data transfer section of the second embodiment during a read transfer cycle to transfer data from the second RAM section to the serial port section;

FIG. 9 is a block diagram of a third embodiment of the data transfer section;

FIG. 10A is a block diagram of a fourth embodiment of the data transfer circuit according to the present invention;

FIG. 10B is a block diagram of a data transfer section, including the data transfer circuit of the fourth embodiment, which is applied to a semiconductor memory having first and second RAM sections connected to bit line pairs 311a and 311b, and 316a and 316b, respectively, and a serial port section connected to data line pairs 3x and 3y, and 3w and 3z;

FIG. 10C is a block diagram of the semiconductor memory to which the data transfer section of the forth embodiment is applied;

FIGS. 13A through 13G are timing charts showing a method of generating control signals in the read transfer cycle shown in FIGS. 11A through 12U; and FIGS. 14A through 14E are timing charts for explaining the timing charts shown in FIGS. 13A through 13G is detail.

DETAILED DESCRIPTION OF THE PREFERRED EMBODIMENTS

Figure 1:
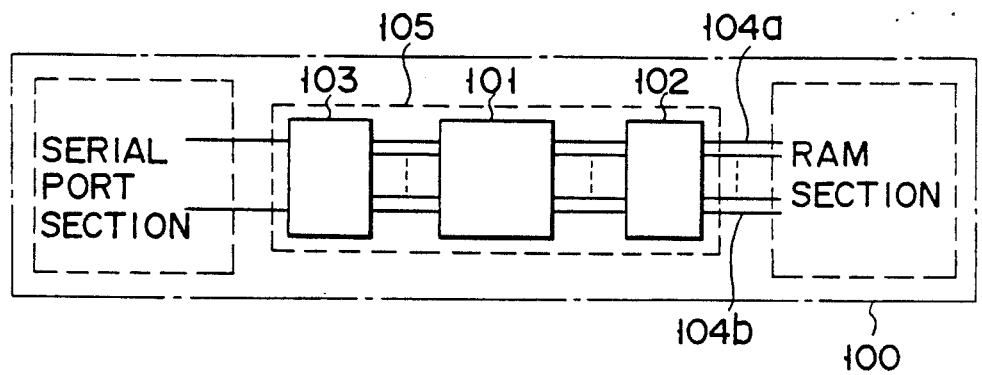
FIG. 1 is a block diagram of a prior-art data transfer section including a prior-art data transfer circuit.

Referring now to the accompanying drawings, a data transfer circuit of the present invention will be described below in detail.

First, referring to FIG. 2A, the configuration of the first embodiment will be described.

The data transfer circuit includes two data latch circuits 11b and 11d and three data transfer gates 11a, 11c, and 11e. Data transfer gate 11a is connected to, for example, a RAM section (not shown) which includes a memory cell array, via lines 411a and 411b and to data latch circuit 11b via lines 412a and 412b. Gate 11a controls data transfers between the RAM section and data latch circuit 11b in response to a control signal 4a. Data transfer gate 11c is connected to data latch circuit 11b via lines 413a and 413b and to data latch circuit 11d via lines 414a and 414b. Gate 11c controls data transfers between circuits 11b and 11c in response to gate control signal 4d. Data transfer gate 11e is connected to circuit 11d via lines 415a and 415b and to, for example, a serial port section (not shown) via lines 416a and 416b. Gate 11e controls data transfers between circuit 11d and the serial port section (not shown) in response to gate control signal 4g. Data transfer gates 11a, 11c and 11e are comprised of N-type MOS transistors Q1 and Q2, Q13 and Q14, and Q25 and Q26 and controls the data transfer in response to gate control signals 4a, 4d, and 4g, respectively. Each data transfer gate is rendered conductive when gate control signal supplied thereto is at a "H" level, and rendered nonconductive when the gate control signal is at a "L" level.

Data latch circuits 11b and 11d are controlled in accordance with equalize signals 4b and 4e and sense signals 4c and 4f, respectively. When the equalize signal goes to a "H" level, the data latch circuit loses data held therein. When the equalize signal is at a "L" level, if the sense signal goes to a "H" level, then the data latch circuit senses and amplifies small data bit signal transferred thereto to latch them during a period of time when the sense signal is at a "H" level.

Data holding circuit 11b is comprised of a sense circuit section including P-type MOS transistors Q6 and Q7, and N-type MOS transistors Q3 and Q4 and an equalize circuit section including an N-type MOS transistor Q5. In this case the common sources of transistors Q6 and Q7 are supplied with a signal on line 11b-1, the common sources of transistors Q3 and Q4 are supplied with a signal on line 11b-2, and the gate of transistor Q5 is supplied with an equalize signal 4b.

Controller 12a includes a P-type MOS transistor Q8, N-type MOS transistors Q9 through Q12, and an inverter Q30. Transistors Q8 and Q9 are in the off state when sense signal 4C is at "L" level. At this time, when equalize signal 4b becomes high, transistor Q5 is turned on, voltages on lines 417a and 417b are equalized. Also transistor Q10 to Q12 are turned on so that voltages on lines 11b-1 and 11b-2 are equalized to voltage VBL as bit line equalize voltage. When equalize signal 4b is at "L" level, transistors Q10 through Q12 are turned off. At this time, when sense signal 4C becomes high, transistors Q8 and Q9 are turned on, but transistors Q10 through Q12 are remained in the off state. Therefore, line 11b-1 is connected to voltage Vcc via transistor Q8 and line 11b-2 connected to voltage Vss via transistor Q9. Thus, small data bit signals on lines 412a and 412b, 417a and 417b, or 413a and 413b are sensed and amplified.

Figure 2B:
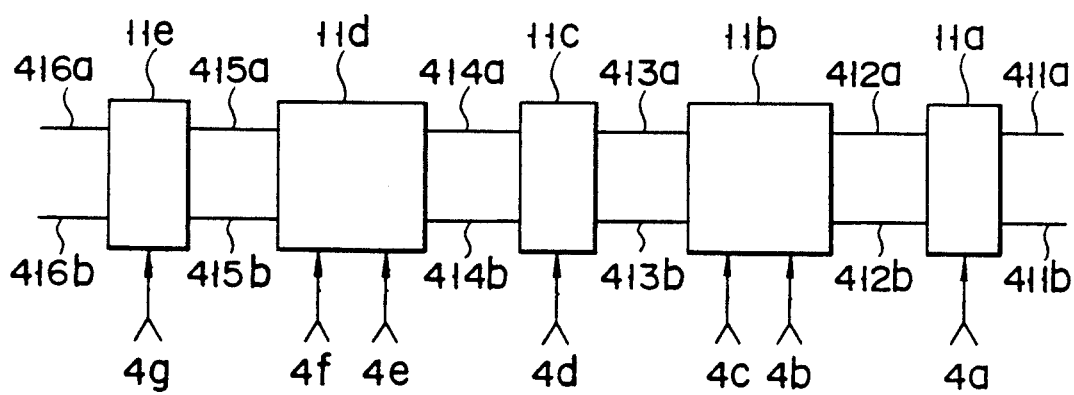
FIG. 2B is a block diagram of the data holding circuit of the first embodiment.

Data latch circuit 11d and controller 12b are similar to circuit 11b and controller 12a. In the data transfer circuit according to the first embodiment, controllers 12a and 12b are omitted in FIG. 2B for reason of convenience of illustration.

Figure 3A:
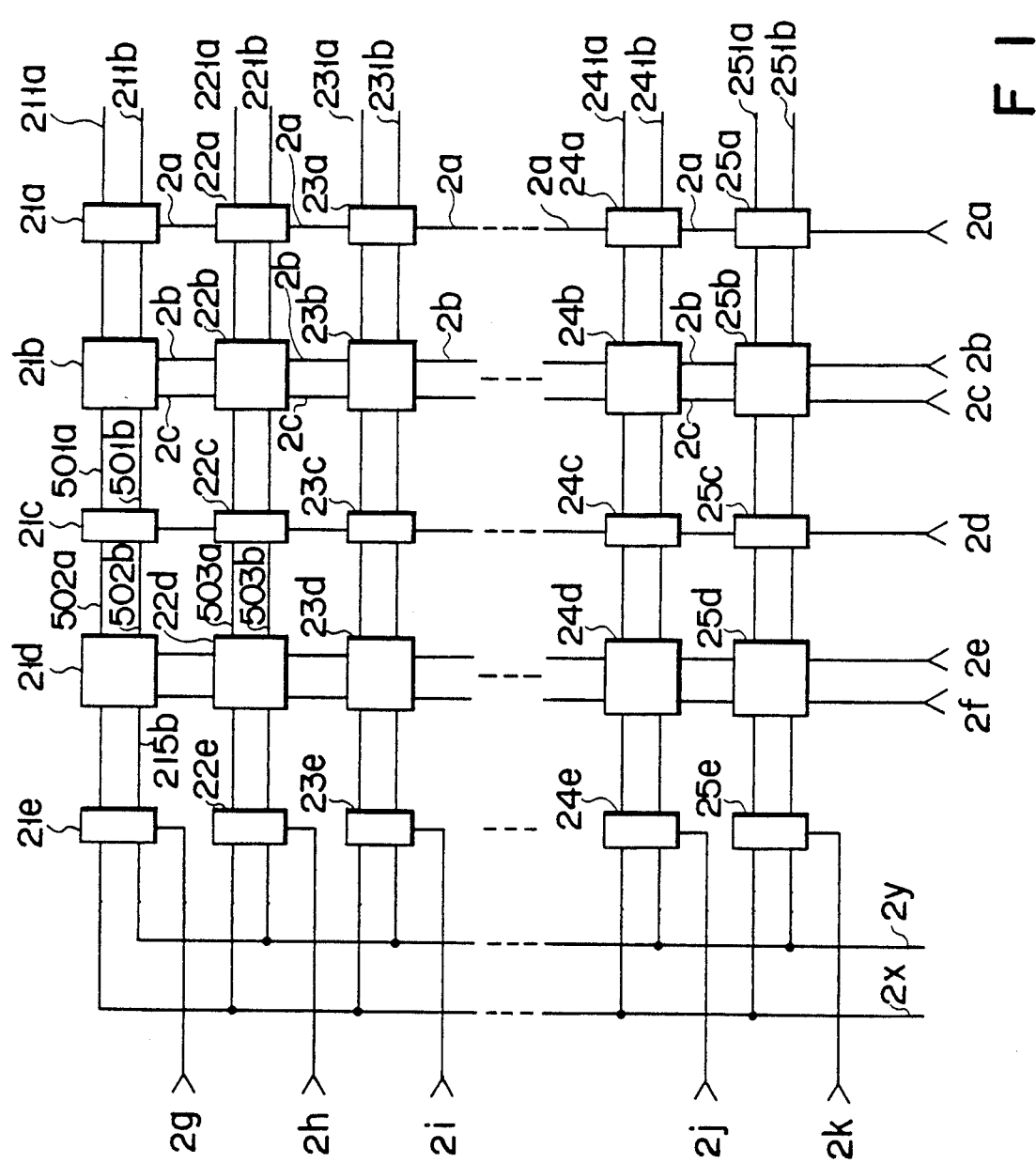
FIG. 3A is a block diagram of a first embodiment of a data transfer section in which the data transfer circuit of FIG. 2A is included and which is applied to a semiconductor memory having a RAM section and a serial port section.

Referring to FIG. 3A, an arrangement of a first embodiment of a data transfer section for controlling data transfers between a RAM section and a serial port section will be described, in which the data transfer circuits according to the first embodiment are included.

An example that the data transfer section according to the first embodiment is applied to a semiconductor memory is shown in FIG. 3C. Data transfer is performed between a RAM section, including an equalizer, a memory cell array, a sense amplifier, a data line gate, a data line and the like, and a RAM port section including a sense write circuit, an input buffer, an output buffer, and the like. This transfer is well known. Also, the data transfer is performed between the RAM section and a serial port section, including sense write circuit M18, input buffer M20, output buffer M22 and the like, via data transfer section M17 according to the present invention. Data bits output from sense write circuit M18 in serial are written into the RAM section via data transfer section M17 in parallel in accordance with a control signal from controller M14 of control section (CTRL SEC.). The control section includes controller M11, M13, and M14, generator M12, and serial decoder M15. Data bits read out from the RAM section in parallel are output to the serial port via data transfer section M17 in serial in accordance with a control signal from controller M14. Controller M14 generating the control signals in accordance with a control signal from controller M13 receiving an address Ain and a control signal from controller M12. In this data transfer section shown in FIG. 3A each data transfer circuit is connected to bit line pairs from the RAM section. In this figure, lines 211a and 211b, 221a and 221b, 231a and 231b, 241a and 241b, and 251a and 251b are bit line pairs of the RAM section and each of them corresponds to lines 411a and 411b in FIG. 2A. Gates 21a-25a, 21c-25c and 21e-25e correspond to data transfer gates 11a, 11c, and 11e, respectively. Data latch circuit 21b-25b and 21d-25d correspond to data latch circuits 11b and 11d, respectively. Signals 2a, 2d, 2g, 2h, 2i, 2j and 2k denote the gate control signals, signals 2b and 2e denote the equalize signals, and signals 2c and 2f denote the sense signals. Lines 2x and 2y denote a pair of data lines connected to the serial port section and hence correspond to lines 416a and 416b in FIG. 2A.

FIG. 3B shows an arrangement of a control section (CTRL SEC.) for generating control signals. The control section includes controller 20h' for generating a control signal in accordance with address Ain input from the external of the semiconductor memory, control signal generator 20h for generating a control signal in accordance with row address strobe signal $\overline{RAS}$, column address strobe signal $\overline{CAS}$, write enable signal $\overline{WE}$, data transfer control signal $\overline{DTE/}$, and signal $\overline{SE}$ from the external, and control signal generator 20h'' for generating a control signal in accordance with the control signals from controller 20h' and generator 20h and signal SC from the external. Generators 20h and 20h'' correspond to generator M12 in FIG. 3C. Controller 20h' corresponds to controller M13 in FIG. 3C. Generator 20g is included in serial decoder M15. Generators 20a through 20f and controller 12a and 12b shown in FIG. 2A is included controller M14.

In the arrangement of FIGS. 3A and 3B, the operation of the data transfer section will be described.

First, the operations in a read transfer cycle-serial read transfer data on the bit line pairs connected to the RAM section to common data lines 2x and 2y will be described with reference to timing charts of FIGS. 4A through 4P. The operations will be described here with respect to the data transfer circuit composed of gates 21a, 21c, 21e and latch circuits 21b, 21d with exception of the case where need arises.

In the initial state of the read transfer cycle in which the row address strobe signal $\overline{RAS}$ is at "H" level so that no data is read out of the RAM section, gate control signal 2a is at "H" level, equalize signal 2b is at "H" level, and sense signal 2c is at "L" level. Circuit 21b and bit lines 211a and 211b connected thereto are equalized to the same voltage potential. At this time gate control signal 2d is at "L" level and thus circuits 21b and 21d are disconnected from each other by gate 21c and can thus operate independently. In this state, therefore, data bits held in circuits 21d through 25d can be read onto common data lines 2x and 2y in serial by switching gate control signals 2g, 2h, 2i, 2j and 2k from "L" to "H" level in sequence.

When signal $\overline{RAS}$ goes from "H" level to "L" level, generators 20a and 20b make gate control signal 2a and equalize signal 2b low in response to a control signal from controller 20h, as shown in D and E of FIG. 4. Memory cells are specified among a memory cell array in the RAM section to read out data bits. The readout data bits are sensed and amplified. Hence, when a bit-line sense initiating signal (not shown) is activated in response to the signal $\overline{RAS}$, "H"-level and "L"-level signals corresponding to one of the data bits appear on bit lines 211a and 211b after a delay time, as shown in B and C of FIG. 4.

At this time, signal 2a is made high as shown in E of FIG. 4, so that the data bit signals on bit line 211a and 211b are transferred to circuit 21b. Generator 20c responds to signal 2a to cause signal 2c to go to "H" level after a predetermined delay time from the time when signal 2a goes to "H" level. In response to signal 2c, circuit 21b senses and amplifies the data bit signals on lines 501a and 501b. As a result, the data bit signals on lines 501a and 501b shift to the "H" and "L" levels, respectively, from the equalize level in circuit 21b as shown in J and K of FIG. 4. When the data sensing operation is initiated, generator 20a responds to signal 2c to cause gate control signal 2a to go to "L" level as shown in E of FIG. 4, so that circuit 21b is disconnected from bit line pair 211a and 211b. In this way latch circuit 21b latches data bit signals on the corresponding bit lines as shown in J and K of FIG. 4.

Next, when a signal (not shown) for determining the initiation of data transfer from circuit 21b to circuit 21d is activated, generator 20f make sense signal 2f low as shown in I of FIG. 4, so that data latching operation of circuit 21d is stopped. In response to the transition of signal 2f, equalize signal 2e is made high for a predetermined time period as shown in G of FIG. 4. Circuit 21d is thus equalized, as well as the signals on wires 502a, 502b, as shown in L and M of FIG. 4. In response to the fall of signal 2e, generator 20d cause gate control signal 2d to go to "H" level as shown in H of FIG. 4, so that circuits 21b is electrically connected to circuit 21d. Consequently, data bit signals latched by circuit 21b are transferred to circuit 21d. Generator 20f responds to the rise of signal 2d to cause sense signal 2f to go to "H" level so that the data bit signals are sensed by circuit 21d.

When the data bit signals are sensed, generator 20d responds to the rise of signal 2f to cause signal 2d to go to "L" level. This results in disconnection between circuits 21b and 21d. When the data transfer is completed, signal 2c is made low in response to signal 2d to stop the latching operation of circuit 21b. After signal 2c is made low, signal 2b is made high to equalize the signals in circuit 21b. Thereafter signal 2a is also made high. As a result, the signals on lines 501a and 501b are equalized and then lines 501a and 501b are connected to equalized bit line pair 211a and 211b to provide for the next data transfer.

In this way, data bits latched by circuits 21b through 25b, namely data bit signals on bit line pairs 211a and 211b through 251a and 251b are transferred to circuits 21d through 25d.

If gate control signal 2d is at "L" level, data bit latched by circuit 21d through 25d can be sequentially read out onto data lines 2x and 2y by making gate control signals 2g through 2k high in sequence, even while new data bits are being transferred from bit line pairs to circuit 21b through 25b. In FIG. 4N, the new data bits are read out onto data lines 2x and 2y from a timing of signal 2k.

An operation of a write transfer cycle will be described with reference to FIGS. 5A through 5R. In the write transfer cycle, data bits serially supplied onto data lines 2x and 2y are transferred onto bit line pairs in parallel.

Figure 5:
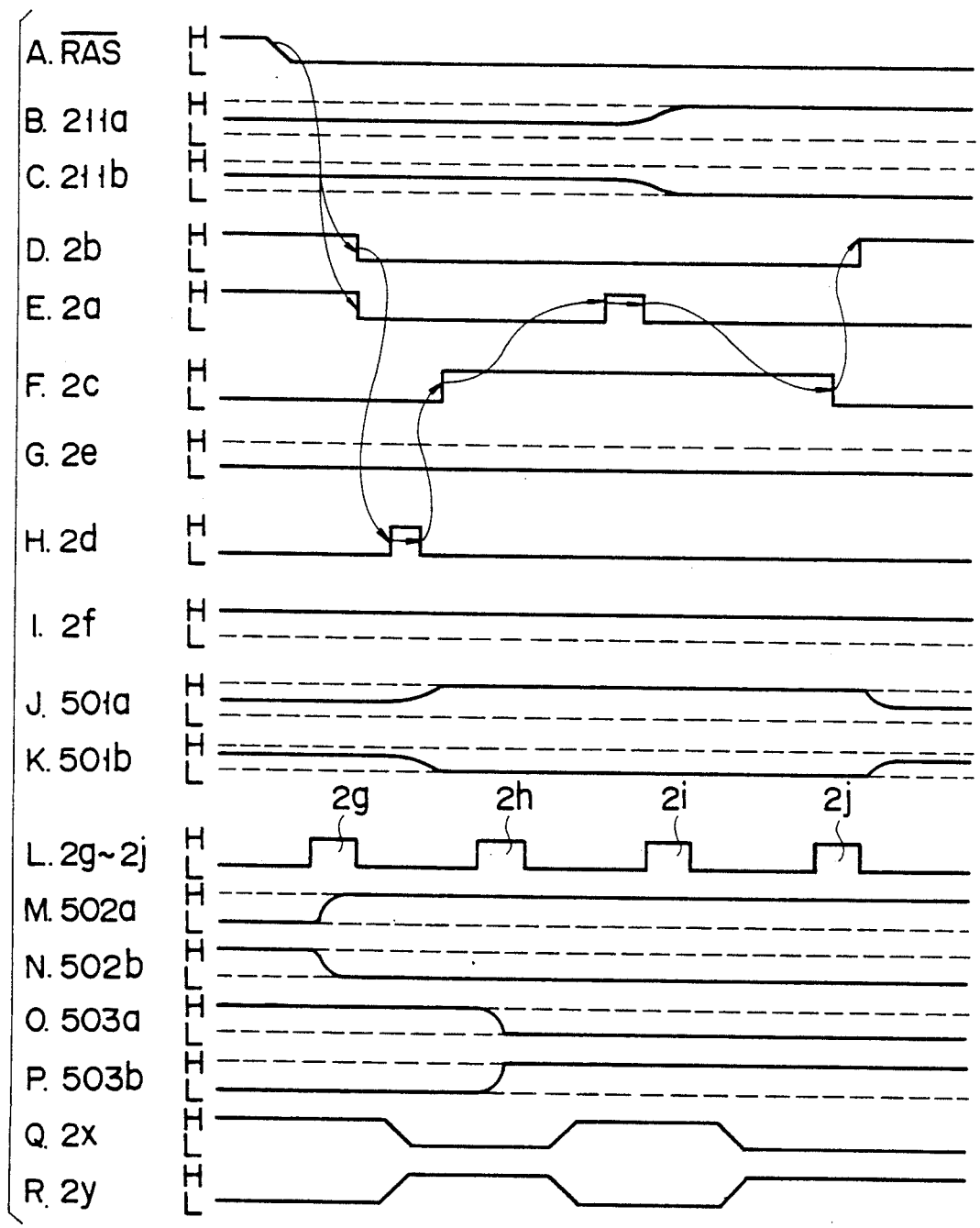
FIGS. 5A through 5R are timing charts showing operations of the first embodiment of the data transfer section during a write transfer cycle to transfer data from the serial port section to the RAM section.

In this initial state, gate control signal 2a is at "H" level as shown in E of FIG. 5, sense signal 2c is at "L" level as shown in F of FIG. 5, and equalize signal 2b is at "H" level as shown in D of FIG. 5. Circuit 21b and bit line pair connected thereto are thus equalized to the same potential level. At this time gate control signal 2d is at "L" level as shown in H of FIG. 5, so that circuits 21d and 21b are disconnected from each other and thus can operate independently.

When gate control signal 2d is at "L" level, signals 2g through 2k which are at "H" level is generated in accordance with signal SC with "H" level. Signals 2g through 2k are sequentially switched from a column specified in accordance with a predetermined start address each time signal SC is switched. When signal SC is at "H" level, data bit is fetched from a S I/0 terminal and is written onto data lines 2x and 2y. At this time, one of gates 21e through 25e corresponding to one of signals 2g through 2k which is at "H" level is opened. Thus, data bit signals latched by one of circuit 21d through 25d which corresponds to the opened gate is forcedly inverted or writes data bit on lines 2x and 2y into the corresponding latch circuit. More specifically, one of data lines precharged to "H" level is fallen to "L" level. At this time, the voltage level of a node fallen to "L" level in the latch circuit is set to be lower than an inverted voltage of the latch circuit. Signal 2f is left high. Thus, data bits on data lines 2x and 2y are written into latch circuit 21d through 25d.

Generators 20a and 20b cause gate control signal 2a and equalize signal 2b to go to "L" level in response to the transition of signal $\overline{RAS}$ to "L" level and signals $\overline{WE}$, $\overline{DTE/}$ and $\overline{SE}$. Consequently circuit 21b and bit line pair 211a and 211b are disconnected. Gate control signal 2d is made high in response to the transition of signal 2b to "L" level, so that the data bit held in circuit 21d is transferred to circuit 21b. As a result, the data bit signals appear on lines 501a and 502b as shown in J and K of FIG. 5. When gate control signal 2d goes to "L" level after the lapse of a predetermined time from the transition of signal 2d to "H" level, disconnection is made between circuits 21d and 21b. Thereafter, in response to the transition of signal 2d to "L" level, sense signal 2c is then made high, so that the data bit signal is sensed and latched. Signal 2a is made high in response to the transition of signal 2c to "H" level, so that the data bit latched by circuit 21b is transferred onto bit line pair 211a and 211b. Thereafter, signal 2a is made low, so that circuit 21b is disconnected from bit line pair 211a and 211b. After signal 2d has been made low, new data bits on common data lines 2x and 2y can be written into circuits 21d through 25d in serial, switching signals 2g through 2k to "H" level in sequence.

According to the data transfer circuit of the first embodiment, as described above, second data latch circuits, connected to a pair of data lines, are arranged separate from first data latch circuits connected to bit line pairs. Therefore, even if data bits disappear in the RAM section when the data bits from the bit line pairs are transferred from the second data latch circuits to the serial port section data bits to be transferred from the second data latch circuits to the serial port section can be switched to the data bits output from the RAM section at a desired timing. More specifically, the timing for transferring data bits held by first data latch circuits to the second data latch circuits can be set to a timing after data bits disappear in the RAM section, since the data bits from the RAM section have already been transferred to the first data latch circuits. Data bits previously transferred and held by the second data latch circuits can be transferred to the serial port section in serial, until the data bits held by the first data latch circuits are transferred to the second data latch circuits. Therefore the switching timing from the previous data bits to the data bits transferred from the RAM section can be set arbitrarily.

Also, if the second data transfer gate is closed, the data transfer from the second data latch circuits to the serial port section can be performed continuously even while the data is transferred from the RAM section to the first data latch circuits. As a result, the data transfer timing from the RAM section to the serial port section can be set arbitrarily. In the write transfer cycle, data bits can be transferred from the first data latch circuits to the RAM section even while new data bits are written from the serial port section into the second data latch circuits, if the data bits held in the second data latch circuits have been transferred to the first data-latch circuits. As mentioned above, this data transfer circuit can arbitrarily set the timing of the data transfer and can continuously input or output the data.

Figure 6A:
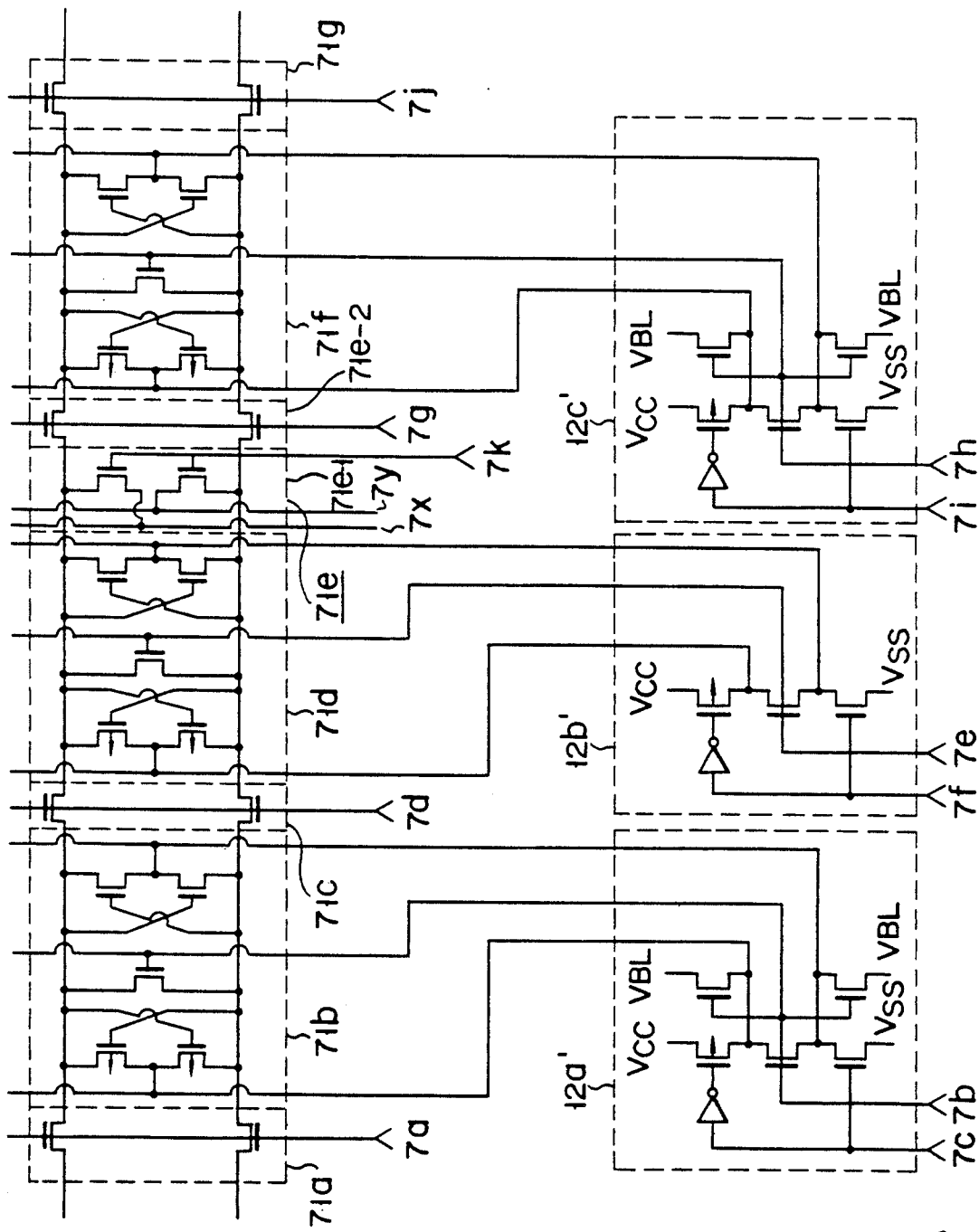
FIG. 6A is a block diagram of a second embodiment of the data transfer circuit of the present invention.

FIG. 6A shows a second embodiment of the data transfer circuit. Controller 12a', 12b', and 12c' operate similar to controller 12a shown FIG. 2A. Gate 71e includes gates 71e-1 and 71e-2 similar to gate 11a in FIG. 2A.

Figure 6B:
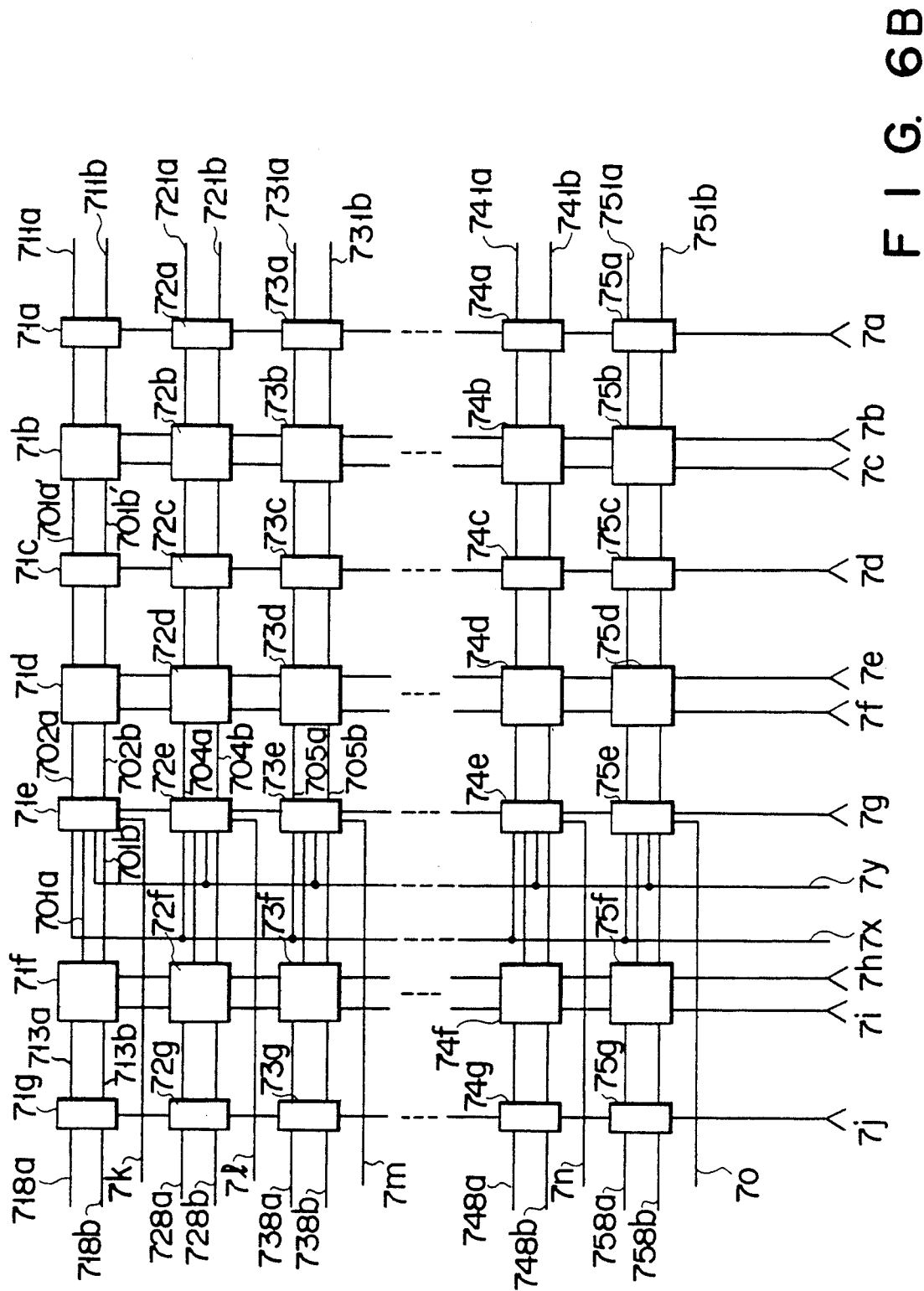
FIG. 6B is a block diagram of a data transfer section according to a second embodiment which is applied to a semiconductor memory having first and second RAM section connected to bit line pairs 711a and 711b, and 178b and 178b respectively, and a serial port section.

FIG. 6B shows a second embodiment of the data transfer section to which data transfer circuit according to the second embodiment of the invention is applied. This embodiment is arranged to perform data transfers between first and second RAM sections and between one of the first and second RAM sections and a serial port section.

In FIG. 6B, the first RAM section corresponds to the RAM section in the first embodiment. Each of bit line pairs 711a and 711b, 721a and 721b, 731a and 731b, 741a and 741b, and 751a and 751b correspond to bit line pairs 211a and 211b, 221a and 221b, 231a and 231b, 241a and 241b, 251a and 251b shown in FIG. 3A, respectively. Second bit line pairs 718a and 178b, 728a and 728b, 738a and 738b and 748a and 748b, and 758a and 758b are connected to the second RAM section. Data transfer gates 71a through 75a, 71c through 75c, and 71g through 75g are the same as data transfer gate 11a of FIG. 2A. Each data transfer gates 71e through 75e corresponds to a combination of two data transfer gates shown in FIG. 2A. Each of first data latch circuits 71b through 75b, second data latch circuits 71d through 75d, and third data latch circuits 71f through 75f is the same as data latch circuit 11b shown in FIG. 2A. Signals 7a, 7d, 7g, 7j, 7k, 7l, 7m, 7n, 7o are gate control signals, signals 7b, 7e, 7h are equalize signals, and signals 7c, 7f, 7i are sense signals.

The operation to transfer data bits from the first RAM section to the data line pair via the first bit line pairs and the operation to transfer data bits on the data line pair to the first RAM section via the first bit line pairs are the same as those in the first embodiment.

The operations of a read transfer cycle to transfer data bits from the second RAM section to the data latch circuits via the second bit line pairs and a serial read cycle to transfer the data bits from the second data latch circuits to the data line pairs will be described with reference to FIGS. 7A through 7V.

In this case, the operations shown in A through I, N through Q and T through V of FIG. 7 are the same as those in the first embodiment. That is, third data latch circuits 71f through 75f latch the data bits read out, sensed and amplified in the second RAM section via gates 71g through 75g. As data bits latched by data latch circuits 21b through 25b are transferred to data latch circuits 21d through 25d in the first embodiment, the data bits held by third data latch circuits 71f through 75f are transferred to second data latch circuits 71d through 75d via gates 71e through 75e. Subsequently, as in the first embodiment, the data bits are serially output onto data line pair 7x and 7y in accordance with gate control signals 7k, 7l, 7m, 7n, and 7o.

In this case data transfer gates 71a through 75a and 71c through 75c must not operate the data transfer. Also, data latch circuits 71b through 75b must not be connected to the bit line pair during the active cycle. Hence, as soon as signal $\overline{RAS}$ becomes low signal 7a is made low, and is not made high until the bit line pairs are equalized, as shown in FIG. 7M. Signal 7d is left at "L" level to disconnect circuits 71b through 75b from circuits 71d through 75d, as shown in FIG. 7J. Signals 7b and 7c applied to first data latch circuits 71b through 75b are left at "H" and "L" levels, respectively, as shown in K and L of FIG. 7.

Next the operations of a serial write cycle to write data bits on the data line pair into the data latch circuits and a write transfer cycle to transfer the data bits from the latch circuits to the second RAM section will be described with reference to A through W of FIG. 8.

Figure 8:
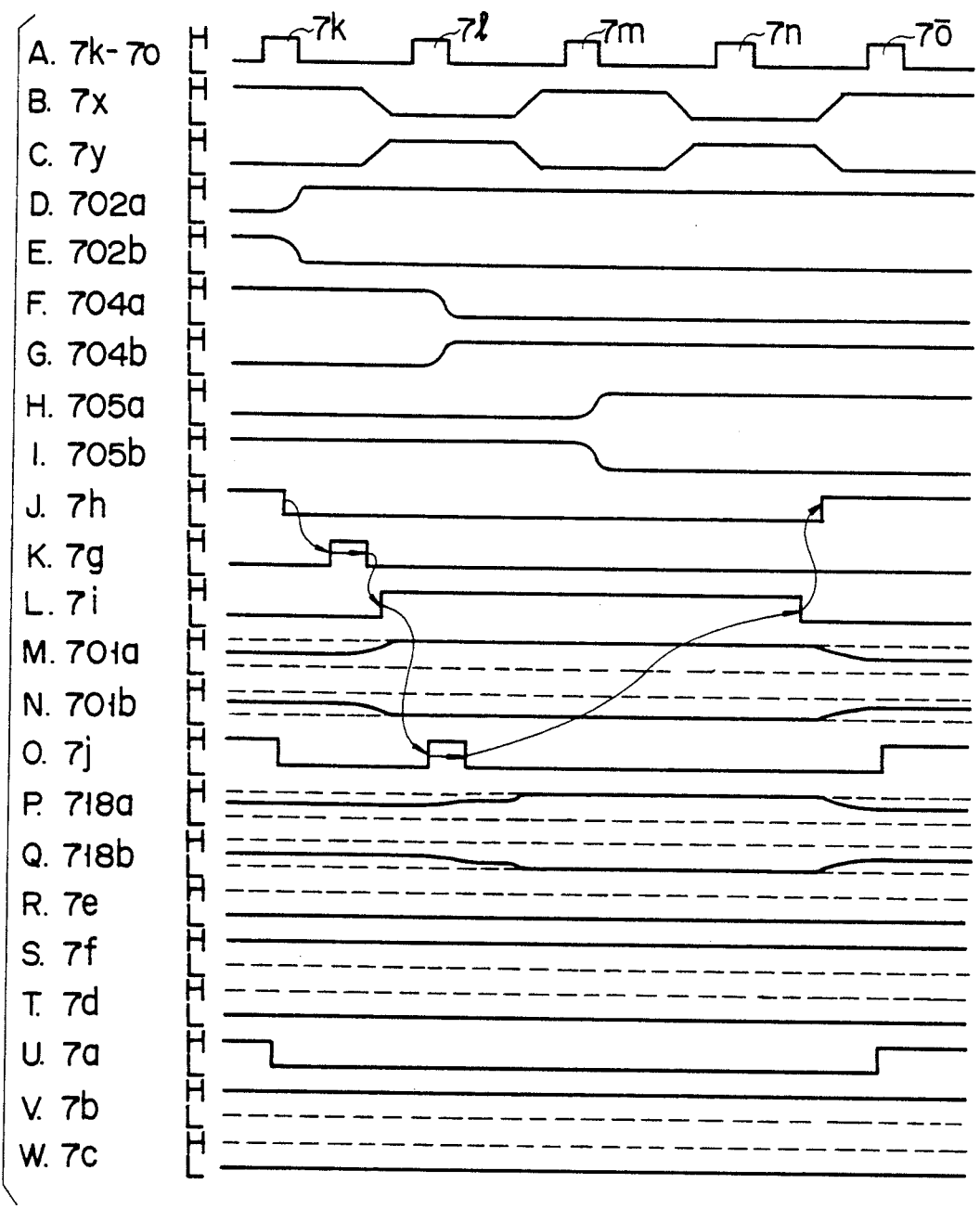
FIGS. 8A through 8W are timing charts showing the operations of the data transfer section of the second embodiment during a write transfer cycle to transfer data from the serial port section to the second RAM section.

As shown in A through I of FIG. 8, data latch circuits 71d through 75d latch data bits on data line pair 7x and 7y in sequence in response to gate control signals 7k through 7o. In this case, notwithstanding signal 7f is at "H" level, the data bits are written into the data latch circuits. This is because "forced inversion" is used in writing the data bits into the data latch circuits as well as the first embodiment. That is, in the data latch circuit of FIG. 6A, the states of the flip-flops constituting the sense circuit section are inverted by forcedly pulling the level of a line which is at "H" level down to "L" level by data line pair 7x and 7y. In the serial write cycle, therefore, signal 7f is left at "H" level, and signal 7e is left at "L" level as shown in R and S of FIG. 8.

As shown in J through Q of FIG. 8, the operation after the data bits are latched by data latch circuits 71d through 75d is the same as that in the first embodiment. That is, the data bits latched by second data latch circuits 71d through 75d are latched by third data latch circuits 71f through 75f via gates 71e through 75e. The data bits latched by third data latch circuits 71f through 75f are transferred to the second RAM section via gates 71g through 75g, as in the first embodiment the data bits held by data latch circuits 21b through 25b are transferred to the RAM section.

In this case, data transfer gates 71a through 75a and 71c through 75c must not operate the data transfer. Also, data latch circuits 71b through 75b must not be connected to the bit line pairs during the transfer cycle. As soon as signal $\overline{RAS}$ is made low, signal 7a is made low, and is not made high until the bit line pairs are equalized, as shown in U of FIG. 8. Signal 7d is left at "L" level to disconnect circuits 71b through 75b from circuits 71d through 75d, as shown in T of FIG. 8. Signals 7b and 7c applied to first data latch circuits 71b through 75b are left at "H" and "L" levels, respectively, as shown in V and W of FIG. 8.

With such an arrangement as described above, to perform data transfers between the first RAM section and the serial port section, it is simply required to operate gates 71a through 75a, 71c through 75c, and 71e through 75e and data latch circuits 71b through 75b, 71d through 75d in the same manner as the first embodiment. For data transfers between the second RAM section and the serial port section, it is simply required to operate gates 71g through 75g, 71e through 75e and data latch circuits 71f through 75f, and 71d through 75d in the same manner as the first embodiment. Thus, gates 71e through 75e and 71c through 75c and data latch circuits 71d through 75d can be used in common for two types of data transfers. This will thus result in the reduction in the number of circuits used and in the area of a chip.

According to the arrangement of FIG. 6B, it is possible to transfer data bits from the first RAM section to the second RAM section by transferring the data bits from the first RAM section to data latch circuits 71d–75d like the read transfer cycle for reading the data bits from the first RAM section and then by transferring the data bits held by data latch circuits 71d–75d to the second RAM section like the write transfer cycle for writing the data bits into the second RAM section. As is apparent, the data transfer in the reverse direction is also possible. It will thus be understood that the data transfer between two RAM sections also becomes possible.

Figure 9:
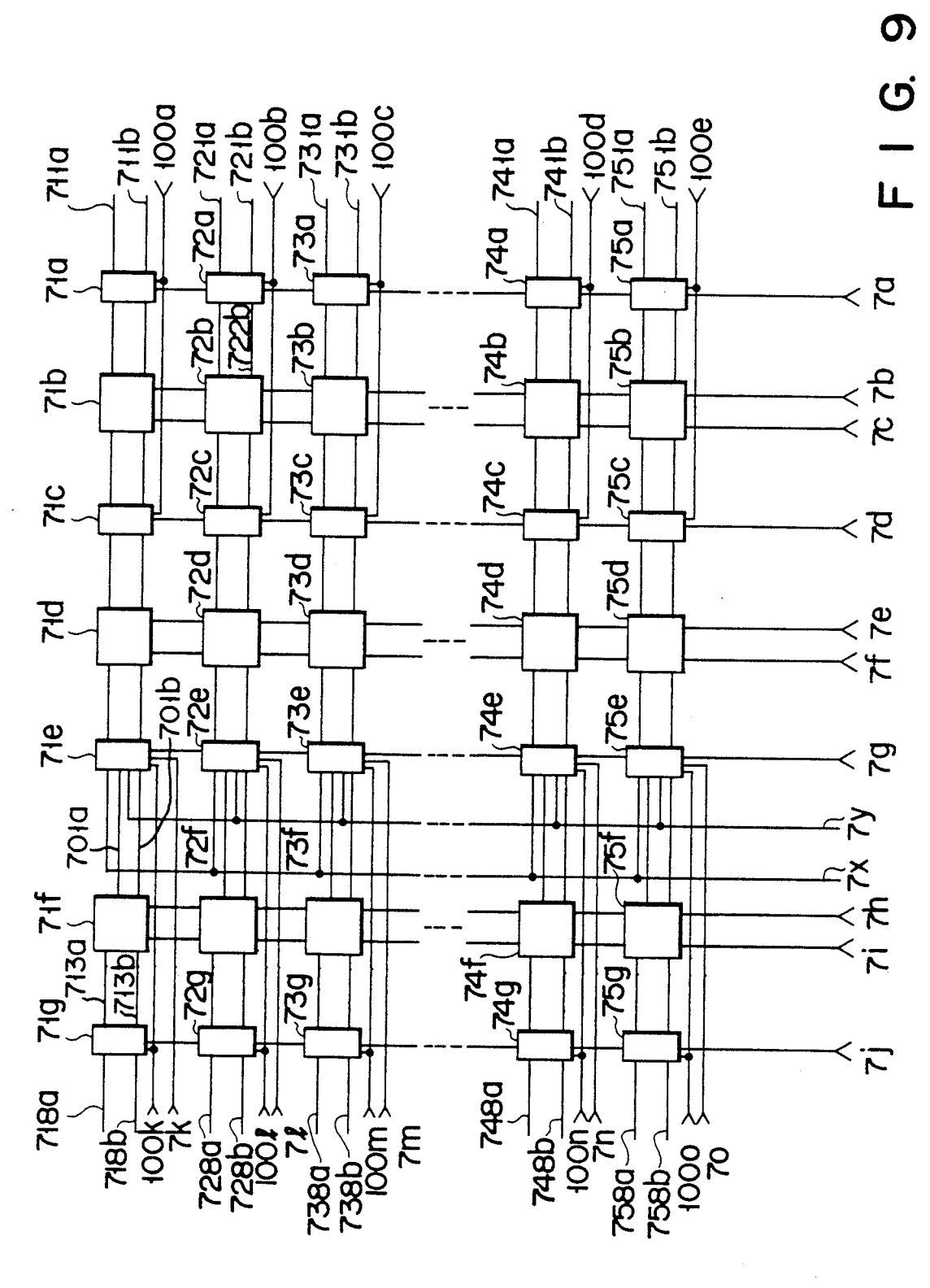

FIG. 9 shows a third embodiment of the data transfer section using a third embodiment of the data transfer circuit of the present invention. In the third embodiment the data transfers between the first and second RAM sections and between one of the first and second RAM sections and the serial port section are possible as is the case with the second embodiment. Moreover, with the third embodiment, data can be transferred between the first and second RAM sections in units of a column.

As shown in FIG. 9, data transfer gates 71a through 75a, and 71c through 75c are supplied with gate control signals 100a–100e as well as gate control signals 7a and 7d, respectively. For example, data transfer gates 71a and 71c are opened only when gate control signals 7a and 100a, and 7d and 100a are together at "H" level, respectively, while the gates are closed when ones of gate control signals are at "L" level. Likewise, data transfer gates 71g through 75g are also supplied with gate control signals 100k, 100l, 100m, 100n, and 100o, respectively, in addition to gate control signal 7j. For example, gate 71g is opened in case that gate control signals 7j and 100k are together at "H" level and the gate is closed in other case. Further, data transfer gates 71e through 75e are supplied with gate control signals 100k, 100l, 100m, 100n, and 100o, respectively, in addition to gate control signals 7k, 7l, 7m, 7n, and 7o and gate control signal 7g. For example, data transfer gate 71e is opened between data transfer circuits 71d and 71f in case that gate control signals 7g and 100k are together at "H" level and the gate is closed in other case. In the other respects the third embodiment has the same arrangement as the second embodiment shown in FIG. 6B.

Next the operation of the third embodiment will be described. As described above, the operations of data transfers between the first and second RAM sections and between one of the first and second RAM sections and the serial port section are the same as those of the second embodiment. Thus, the operation other than the above operations, namely, the operation of the data transfer between the first and second RAM sections in units of a column will be described taking the data transfer from the first RAM section to the second RAM section by way of example.

If gate control signal 7a is made high and some selected signals of gate control signals 100a through 100e are made high, then data bits are transferred from the first RAM section to some of first data holding circuits 71b through 75b which correspond to the some selected signals, via bit line pairs connected to the first RAM section. The corresponding data latch circuits sense and latch the transferred data bits in response to sense signal 7c going high. Thereafter, the data bits held by the corresponding data latch circuits are transferred to some of the second data latch circuits which corresponds to the corresponding data latch circuit. In this way the data bits are transferred from the first RAM section to the corresponding second data latch circuits as in the case of the read transfer cycle-serial read in which data is read from the first RAM section onto data line pair 7x and 7y. Subsequently, as in the case of the write transfer cycle in which data on data line pair 7x and 7y is written into the second RAM section, the data bits are transferred from the corresponding second data latch circuits to the second RAM section. In this case, the data transfer in units of a column can be performed by selectively making some of gate control signals 100k through 100o high in an usual operation. At this time, after the second data latch circuits latch the data bits, and gates 71c through 75c are turned off, a subsequent data bits may be transferred to first data latch circuits. The data transfer can thus be performed continuously. The same is true of the data transfer from the second RAM section to the first RAM section in units of a column.

FIG. 10A shows a fourth embodiment of the data transfer circuit according to the present invention. FIG. 10B shows a data transfer section of a fourth embodiment to which the data transfer circuit of the fourth embodiment is applied. Controller 12a″ and 12b″ shown in FIG. 10A is not included in the data transfer section as in the first embodiment, but the data transfer section are illustrated such that the data transfer circuit is controlled in accordance with, for example, signals 3b, 3c, for convenience of illustration. Gates 31a and 31e include gate 31a-1 and 31a-2 and 31e-1 and 31e-2, respectively. Gate 31a-1 and 31a-2 are controlled in accordance with signal 30k and signals 3a and 30a, respectively. Gate 31e-1 and 31e-2 are controlled in accordance with signal 30k′ and signals 30a and 3g, respectively. Gate 31a-1 and 31e-1 are connected to data line pairs 3w and 3z, and 3x and 3y, respectively. FIG. 10C shows a semiconductor memory to which the data transfer section of the fourth embodiment is applied. A serial port section functions a first or second serial port section in accordance with selection of a select gate.

Figure 2A:
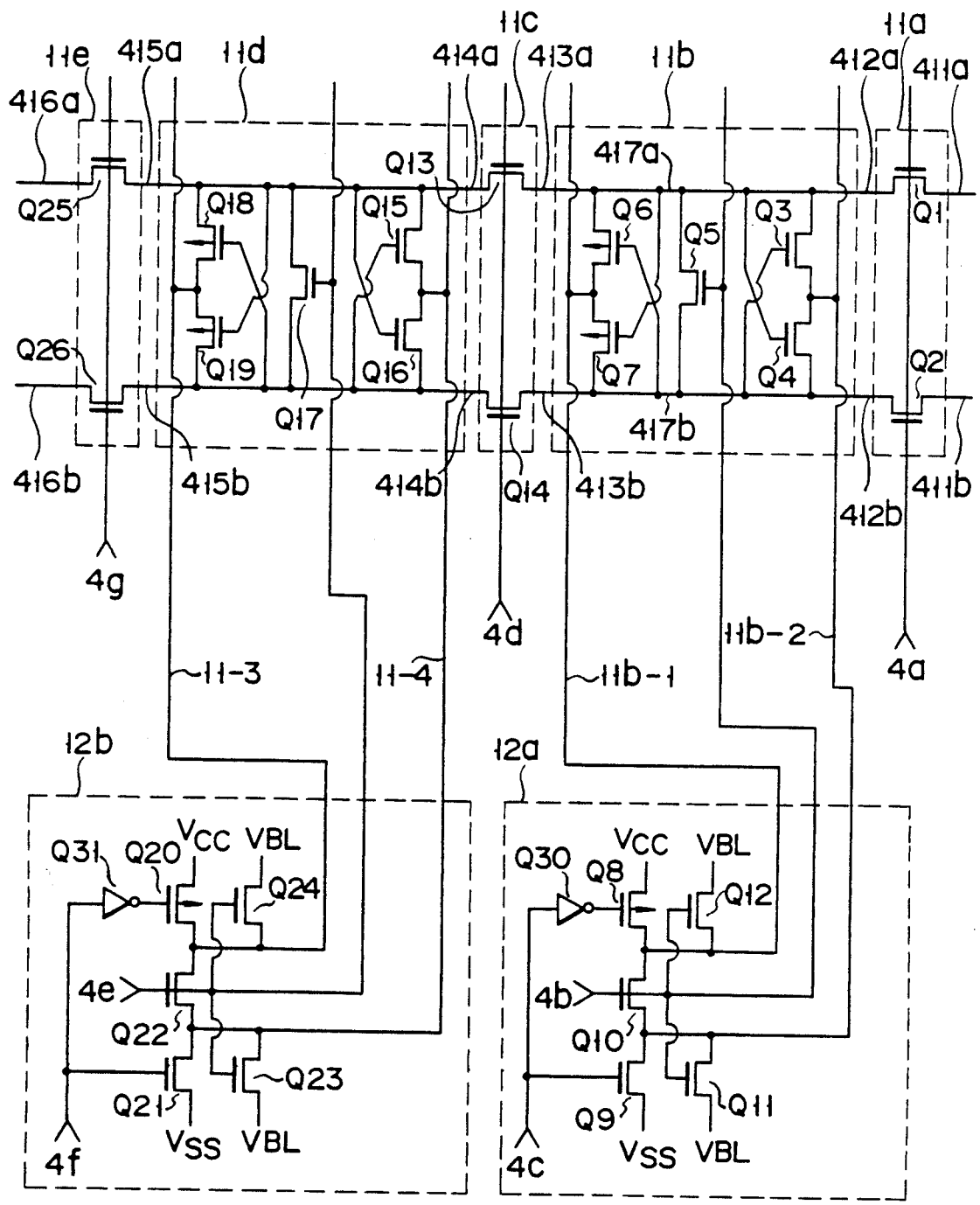
FIG. 2A is a diagram showing the configuration of a data transfer circuit according to a first embodiment of the present invention.

In FIG. 10B, data latch circuits 31b through 35b and 31d through 35d are the same as circuits 11b and 11d shown in FIG. 2A. Signals 3b and 3e are equalize signals and signals 3c and 3f are sense signals. First data transfer gates 31a through 35a control data transfers between data latch circuits 31b through 35b and the bit lines pairs 311a and 311b through 351a and 351b in response to common gate control signal 3a and the respective gate control signals 30a through 30e. First data transfer gates 31a through 35a also control the data transfer between data latch circuits 31b through 35b and data line pair 3w and 3z in response to gate control signals 30k through 30o, respectively. Second data transfer gates 31c trough 35c control the data transfer between data latch circuits 31b through 35b and data latch circuits 31d through 35d in response to common gate control signal 3d and gate control signals 30a through 30e, respectively. Third data transfer gates 31e through 35e control the data transfer between data latch circuits 31d trough 35d and the bit line pairs 316a and 316b through 356a and 356b in response to common gate control signal 3g and the respective gate control signals 30a through 30e. Third data transfer gates 31e through 35e also control the data transfer between data latch circuits 31d through 35d and data line pair 3x and 3y in response to gate control signals 30k′ through 30o′.

Next an operation of a read transfer cycle-serial read to transfer data from the first RAM section connected to bit line pairs 311a and 311b through 351a and 351b onto data line pair 3x and 3y will be described with reference to A through U of FIG. 11 taking gates 31a, 31c, 31e and data latch circuits 31b, 31d by way of example.

Figure 11:
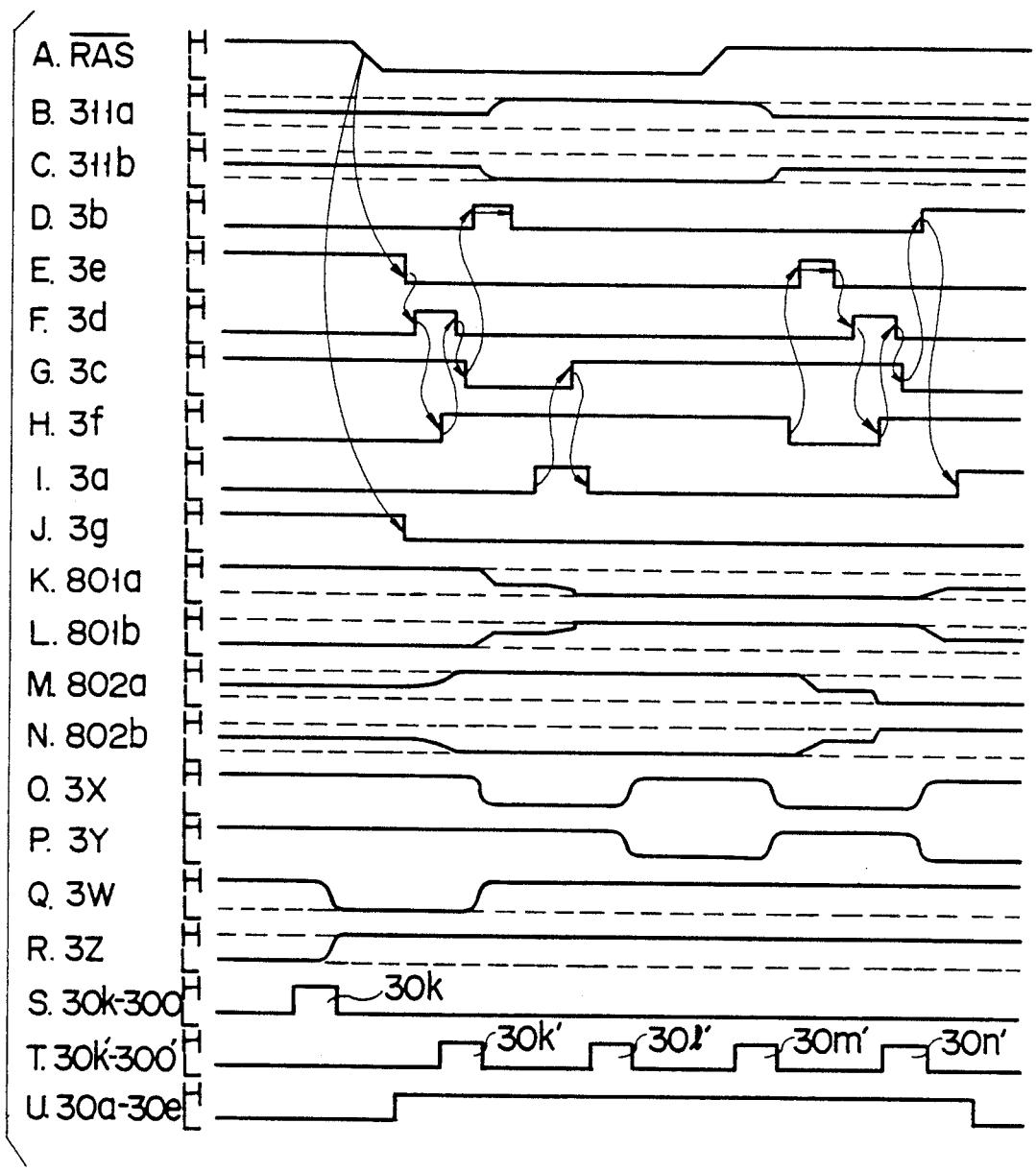
FIG. 11A through 11U are timing charts showing the operations of the data transfer section of the fourth embodiment during a read transfer cycle to transfer data from the first RAM section, where the last transfer cycle prior to this cycle is a read transfer cycle to transfer data from the second RAM section.

When signal $\overline{RAS}$ first shifts from "H" level to "L" level, signals 3e and 3g go to "L" level according to the shift as shown in E and J of FIG. 11. In response to the shift of signal 3e to "L" level, signal 3d goes to "H" level as shown in F of FIG. 11, so that data bit held by circuit 31b is transferred to data latch circuit 31d. Subsequently signal 3f goes to "H" level as shown in H of FIG. 11, so that circuit 31d senses and latches the transferred data bit. The result of this operation is shown in M and N of FIG. 11.

When signal 3f goes to "H" level, signal 3d is made low, thereby making disconnection between circuits 31b and 31d by gate 31c. When signal 3d goes to "L" level, signal 3c is made low, thereby releasing the data latch of circuit 31b. Signal 3b is made being "H" pulse in response to the shift of signal 3c to "L" level, thereby equalizing circuit 31b. At a time when the first RAM section finishes sensing the data bit, signal 3a is made high as shown in I of FIG. 11. The data bit signals transferred from bit line pair 311a and 311b via gate 31a are sensed and latched by circuit 31b in response to signal 3c made high in a predetermined period of time in response to the shift of signal 3a to "H" level. Signal 3a then goes to "L" level, thereby disconnecting the first RAM section from the data latch circuit. In this case the signal waveforms on wires 801a and 801b vary as shown in K and L of FIG. 11.

When the signal used for transferring the data bit held by circuit 31b to circuit 31d is activated, signal 3f goes to "L" level, causing circuit 31d to release the data latch. Subsequently signal 3e is made being a high pulse to equalize circuits 31d. When signal 3e goes to "L" level, signal 3d goes to "H" level, causing the data bit held by circuit 31b to be transferred to circuit 31d. When signal 3f goes to "H" level after a predetermined period of time when signal 3d goes to "H" level, the data bit is sensed and latched by circuit 31d. Signal 3d is made low in response to the shift of signal 3f to "H" level, thereby disconnecting circuit 31b from circuit 31d.

In response to the shift of signal 3d to "L" level, signal 3c is made low to release the data latch of circuit 31b. Further signal 3b is made high, equalizing circuit 31b. When signal 3b goes to "H" level, signal 3a is made high. In this case, however, when the equalizing of bit line pair 311a and 311b is not initiated, signal 3a is left low until the equalizing of the bit line pair is initiated.

During the above operations signals 30a through 30e all remain high, and data line pairs 3x and 3y and 3w and 3z are equalized to "H" level when they are not selected. In the inherent operation, after data lines pairs 3x and 3y, and 3w and 3z are equalized to "H" level, one of signals 30k through 30o'is made high to output data bit. For this reason both signals on data line pair 3x and 3y or 3w and 3z are at "H" level during some periods in the figure.

In the above description, since a previous transfer cycle, which means a last transfer cycle previous to a current transfer cycle, is the data transfer from the second RAM section including bit line pair 316a and 316b to data latch circuits 31b through 35b, signal $\overline{RAS}$ goes to "L" level and signal 3e thus shifts from "H" level to "L" level. In a case that the previous transfer cycle is the data transfer from the first RAM section to data line pair 3x and 3y, when signal $\overline{RAS}$ goes to "L" level, signal 3b goes from "H" level to "L" level. For this reason, the data bits transferred from bit line pairs 316a and 316b, and so on, and held by circuits 31b through 35b are readout onto data lines 3w and 3z in accordance with signals 30k through 30o made high in sequence. One of data lines pairs 3x and 3y, and 3w and 3z to be connected to a sense write circuit is selected in accordance with signal 3d and a signal (not shown) for determining whether the data transfer should be performed from the first RAM section or from the second RAM section.

Figure 12:
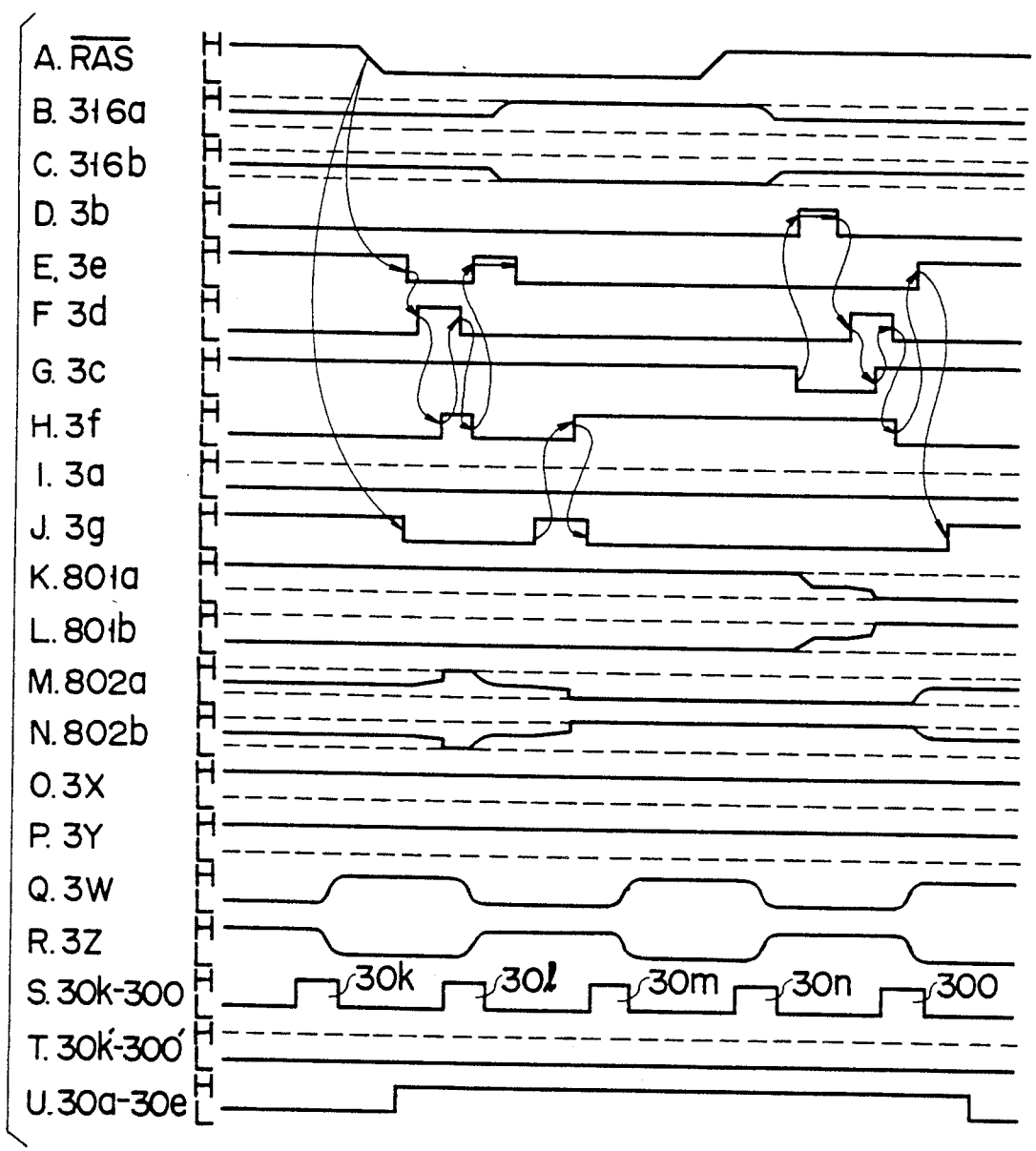
FIGS. 12A through 12U are timing charts showing the operations of the data transfer section of the fourth embodiment during a read transfer cycle to transfer data from the second RAM section, where the last transfer cycle prior to this cycle is the read transfer cycle as well as this cycle.

FIG. 12 shows the operation in the case where the previous transfer cycle is a read transfer cycle to transfer data bits from the second RAM section to circuits 31b through 35b, and current transfer cycle is also the read transfer cycle.

When signal $\overline{RAS}$ goes to "L" level, signals 3e and 3g go to "L" level so that bit line pair 316a and 316b is electrically disconnected from circuit 31d. Signal 3d goes to "H" level in response to signal 3e going low with the result that a data bit is transferred from circuit 31b to circuit 31d. Subsequently signal 3f goes to "H" level, causing circuit 31d to sense and latch the data bit. When signal 3f goes to "H" level, signal 3d goes to "L" level, and subsequently signal 3f goes to "L" level. Signal 3e is made being "H" pulse in response to signal 3f going low, thereby equalizing circuit 31d. Sensing of the second RAM section is initiated, and signal 3g is made high after a delay, so that the data bit on bit line pair 316a and 316b is transferred to circuit 31d. Signal 3g is made high, and after a delay signal 3f is made high. Circuit 31d senses and latches the data bit transferred thereto in response to signal 3f.

When a signal used for transferring the data bit held by circuit 31d to circuit 31b is activated, signal 3c is made low so that circuit 31b releases data latching and is then equalized in response to a high pulse of signal 3b. Signal 3d is made high in response to signal 3b going to "L" level, causing the data bit held by circuit 31d to be transferred to circuit 31b. Signal 3c goes to "H" level after a delay from a time when signal 3d goes to "H" level, causing circuit 31b to sense and latch the data bit. When signal 3c goes to "H" level, signal 3d goes to "L" level and subsequently circuit 31b is disconnected from circuit 31d. Then, the data latch of circuit 31d is released when signal 3f goes to "L" level. Thereafter, signal 3e is made high, to equalize circuit 31d and signal 3g is made high to connect circuit 31d to the second RAM section.

During this cycle signal 3a remains low. Even if signal 3e goes to "H" level, signal 3g will not go to "H" level unless equalizing of the bit line pairs of the second RAM section is initiated. During the above operation, by causing signals 30k through 30o to go to "H" level in sequence, data bits can be serially output onto data line pair 3w and 3z.

In the above operation, circuit 31d is equalized, immediately after the data bit held by circuit 31b is transferred to circuit 31d, with regards to signals on lines 802a and 802b. This is to prepare the circuit for the data transfer from the second RAM section.

A method of generating the signals used for controlling the operations shown in FIGS. 11A through 12U will be described with reference to FIGS. 13A through 13G. It is to be noted that FIGS. 13A through 13G shows signal waveforms in the operation of a read transfer cycle-serial read from the first or second RAM section.

The control signals in FIG. 11 A through FIG. 12U are generated by assigning signals shown in FIG. 13 to a right side circuit portion or a left side circuit portion of the data transfer section shown in FIG. 10B with regards to circuits 31c through 35c. Signal $\overline{DTE/}$ is supplied from the external of the semiconductor memory to control the data transfer between the data latch circuits. The sense and latch operations for data bits on bit line pairs are initiated when a RAM section sense signal SEN goes to "H" level and the latch operation is released when the signal SEN goes low.

In operation, when signal $\overline{RAS}$ goes from "H" level to "L" level, equalize signal 3be goes to "L" level and gate control signal 3ag also goes to "L" level. When signal 3be goes to "L" level, gate control signal 3d0 goes to "H" level. As a result, after a predetermined period of time, sense and latch control signal 3cf goes to "H" level and signal 3d0 goes to "L" level in response to signal 3cf going high. In response to the shift of signal 3d0 to "L" level, signal 3cf goes to "L" level, causing signal 3be to be a "H" pulse. Signal 3ag goes to "H" level after signal 3be has gone from "H" to "L" level and after a predetermined period from time when signal SEN goes to "H" level. Signal 3cf goes to "H" level after a predetermined period from time when signal 3ag goes to "H" level and, as a result of this, signal 3ag goes to "L" level. When externally applied transfer control signal $\overline{DTE/}$ subsequently goes to "H" level, signal 3cf goes to "L" level and, as a result of this, signal 3be is made being "H" pulse. When signal 3be goes back to "L" level, signal 3d0 goes to "H" level and, as a result of this, signal 3cf goes to "H" level after a predetermined period of time. Subsequently signal 3d0 goes to "L" level, and as a result of this, signal 3cf goes "L" level. Signal 3ag goes to "H" level after a predetermined period from time when signal 3be then goes to "H" level. In this case, however, when the signal to equalize the bit line pairs of the RAM section is not activated, signal 3ag does not go to "H" level even if signal 3be goes to "H" level. Signal 3ag remains low until the equalize signal is activated.

A method of generating signals 3a through 3f from signals 3be, 3ag, 3d,0 3cf, will be described with reference to A through E of FIG. 14. Referring to FIG. 14B, generations of equalize signals 3b and 3e from signal 3be will be described. In the region A, when signal $\overline{RAS}$ goes to "L" level, signals 3b and 3e go to "L" level on selective and nonselective sides. The selective side refers to a side to which data bits are transferred. Where a data bit is transferred from bit line pair 311a and 311b, signals on the selective side are 3a, 3b, 3c. Whereas, signals 3g, 4f, 3e are the signals on the selective side where a data bit is transferred from bit line pair 316a and 316b.

In the B region of signal 3be, the signal on the selective side of signals 3b and 3e is caused to be a "H" pulse at this timing in order to equalize the data latch circuit. The signal on the nonselective side remains low. In the C region, a signal which is on the nonselective side, of signals 3b and 3e is caused to be a "H" pulse at this timing, while the signal on the selective side remains low. In the D region, a signal, which is on the selective side, of signals 3b and 3e goes to "H" level at this timing, while the signal on the nonselective side remains low.

Referring to FIG. 14C, generations of gate control signals 3a and 3g for controlling connection between data latch circuits and bit line pairs from signal 3ag will be described. In the E region, when signal $\overline{RAS}$ goes to "L" level, signals 3a and 3g in any side go to "L" level at this timing. In the F region, one of signals 3a and 3g which is on the selective side is caused to be a "H" pulse at this timing, while the other remains low. In the G region, one of signals 3a and 3g which is on the selective side goes to "H" level at this timing, while the other remains low.

Referring to FIG. 14D, generation of signal 3d will be described. Signal 3do causes signal 3d to go to "H" or "L" level at this timing.

Referring to FIG. 14E, generations of sense and latch signals 3c and 3f of data latch sections from signal 3cf will be described. In the I region, one of signals 3c and 3f which is on the selective side in the transfer cycle prior to the current transfer cycle, goes to "H" level at this timing and the other signal remains high. In the J region, one of signals 3c and 3f which is on the selective side in the current cycle goes to "L" level at this timing and the other signal on the nonselective side remains high. In the K region, one of signals 3c and 3f on the selective side goes to "H" level at this timing, while the other on the nonselective side remains high. In the L region, one of signals 3c and 3f on the nonselective side goes to "L" level at this timing, while the other signal on the selective side remains high. In the M region, one of signals 3c and 3f on the nonselective side goes to "H" level at this timing, while the other signal on the selective side remains high. In the N region, one of signals 3c and 3f on the selective side goes to "L" level at this timing, while the other signal on the nonselective side remains high. As described above, the control signals shown in FIGS. 11 and 12 are generated.

What is claimed is:

1. A circuit for transferring data from a first RAM section to a first serial port section during a read transfer cycle in response to activation of a row address strobe signal, comprising:

first latch means for holding data in response to activation of a first sense signal;

second latch means for holding data in response to activation of a second sense signal;

first RAM section coupling means, coupled to the first RAM section, for transferring data to and from the first RAM section;

first serial port section coupling means, coupled to the first serial port section, for transferring data to and from the first serial port section;

first gate means, coupled between the first RAM section coupling means and the first latch means, for transferring data between the first RAM section coupling means and the first latch means in response to activation of a first gate control signal, wherein the first gate means is rendered conductive at times when the first gate control signal is activated and is rendered nonconductive at times when the first gate control signal is not activated;

second gate means, connected between the first latch means and the second latch means, for transferring data between the first latch means and the second latch means in response to activation of a second gate control signal, wherein the second gate means is rendered conductive at times when the second gate control signal is activated and is rendered nonconductive at times when the second gate control signal is not activated;

third gate means, coupled between the first serial port section coupling means and the second latch means, for transferring data between the first serial port section coupling means and the second latch means in response to activation of a third gate control signal, wherein the third gate means is rendered conductive at times when the third gate control signal is activated and is rendered nonconductive at times when the third gate control signal is not activated; and control means, coupled to the first and second latch means and to the first, second, and third gate means, and responsive to activation of the row address strobe signal, for activating and deactivating the first and second sense signals and the first, second, and third gate control signals, wherein the control means includes:

means, during a read transfer cycle, for activating the first sense signal after first data is transferred to the first latch means in response to activation of the first gate control signal, and for subsequently deactivating the first sense signal after the first data is transferred from the first latch means in response to activation of the second gate control signal;

means, during a read transfer cycle, for deactivating the second sense signal after second data is transferred from the second latch means in response to activation of the third gate control signal, and for subsequently activating the second sense signal after the first data is transferred to the second latch means in response to activation of the second gate control signal;

means, during a read transfer cycle, for activating the first gate control signal when the first RAM section coupling means is transferring the first data in response to activation of the row address strobe signal, and for subsequently deactivating the first gate control signal after the first data is transferred to the first latch means;

means, during a read transfer cycle, for activating the second gate control signal when the first latch means is holding the first data, and for subsequently deactivating the second gate control signal after the first data is transferred to the second latch means; and means, during a read transfer cycle, for activating the third gate control signal when the second latch means is holding the first data, and for subsequently deactivating the third gate control signal after the first data is transferred to the first serial port section coupling means.

2. A circuit in accordance with claim 1, which transfers data from the first RAM section or a second RAM section to a second serial port section or the first serial port section, respectively, in response to activation of the row address strobe signal, and further comprising:

second RAM section coupling means, coupled to the second RAM section, for transferring data to and from the second RAM section;

second serial port section coupling means, coupled to the second serial port section, for transferring data to and from the second serial port section;

second RAM gate means, coupled between the second RAM section coupling means and the second latch means, for transferring data between the second RAM section coupling means and the second latch means in response to activation of a second RAM gate control signal, wherein the second RAM gate means is rendered conductive at times when the second RAM gate control signal is activated and is rendered nonconductive at times when the second RAM gate control signal is non activated; and second serial gate means, coupled between the second serial port section coupling means and the first latch means, for transferring data between the second serial port section coupling means and the first latch means in response to activation of a second serial gate control signal, wherein the second serial gate means is rendered conductive at times when the second serial gate control signal is activated and is rendered nonconductive at times when the second serial gate control signal is not activated; and wherein the control means is coupled to the second RAM gate means and to the second serial gate means, and is responsive to activation of the row address strobe signal, for activating and deactivating the second RAM gate control signal and the second serial gate control signal, and wherein the control means further includes:

means, during a read transfer cycle for a transfer from the second ram section to the second serial port section, for activating the second RAM gate control signal when the second RAM section coupling means is transferring the first data in response to activation of the row address strobe signal, and for subsequently deactivating the second RAM gate control signal after the first data is transferred to the second latch means; and means, during a read transfer cycle for a transfer from the second RAM section to the second serial port section, for activating the second serial gate control signal when the first latch means is holding the first data, and for subsequently deactivating the second serial gate control signal after the first data is transferred to the second serial port section coupling means;

wherein the means for activating and deactivating the first sense signal includes means, during a read transfer cycle for a transfer from the second RAM section to the second serial port section, for deactivating the first sense signal after second data is transferred from the first latch means in response to activation of the second serial gate control signal, and for subsequently activating the first sense signal after the first data is transferred to the first latch means in response to activation of the second gate control signal;

wherein the means for activating and deactivating the second sense signal includes means, during a read transfer cycle for a transfer from the second RAM section to the second serial port section, for activating the second sense signal after the first data is transferred to the second latch means in response to activation of the second RAM gate control signal, and for subsequently deactivating the second sense signal after the first data is transferred from the second latch means in response to activation of the second gate control signal; and wherein the means for activating and deactivating the second gate signal includes means, during a read transfer cycle for a transfer from the second RAM section to the second serial port section, for activating the second gate control signal when the second latch means is holding the first data, and for subsequently deactivating the second gate control signal after the first data is transferred to the first latch means.

3. A circuit in accordance with claim 1, which transfers data from the first serial port section to the first RAM section during a write transfer cycle in response to activation of the row address strobe signal, and in which the control means further comprises:

means, during a write transfer cycle, for activating the first sense signal after write data is transferred to the first latch means in response to activation of the second gate control signal, and for subsequently deactivating the first sense signal after the write data is transferred from the first latch means in response to activation of the first gate control signal;

means, during a write transfer cycle, for activating the second sense signal;

means, during a write transfer cycle, for activating the first gate control signal when the first latch means is holding the write data, and for subsequently deactivating the first gate control signal after the write data is transferred to the first RAM section coupling means;

means, during a write transfer cycle, for activating the second gate control signal in response to activation of the row address strobe signal when the second latch means is holding the write data, and for subsequently deactivating the second gate control signal after the write data is transferred to the first latch means; and means, during a write transfer cycle, for activating the third gate control signal when the first serial port section coupling means is transferring the write data, and for subsequently deactivating the third gate control signal after the write data is transferred to the second latch means.

4. A circuit in accordance with claim 1, which transfers data from a second RAM section to the first serial port section during a read transfer cycle in response to activation of a row address strobe signal, and further comprising:

third latch means, coupled to the third gate means, for holding data in response to activation of a third sense signal;

second RAM section coupling means, coupled to the second RAM section, for transferring data to and from the second RAM section; and fourth gate means, coupled between the second RAM section coupling means and the third latch means, for transferring data between the second RAM section coupling means and the third latch means in response to activation of a fourth gate control signal, wherein the fourth gate means is rendered conductive at times when the fourth gate control signal is activated and is rendered nonconductive at times when the fourth gate control signal is not activated;

wherein the third gate means includes means for transferring data between the third latch means and the second latch means in response to activation of a fifth gate control signal, wherein the third gate means is rendered conductive at times when the fifth gate control signal is activated and is rendered nonconductive at times when the fifth gate control signal is not activated; and wherein the control means is coupled to the third latch means and to the third and fourth gate means, and is responsive to activation of the row address strobe signal, for activating and deactivating the third sense signal and the fourth and fifth gate control signals, and wherein the control means further includes:

means, during a read transfer cycle, for activating the third sense signal after first data is transferred to the third latch means in response to activation of the fourth gate control signal, and for subsequently deactivating the third sense signal after the first data is transferred from the third latch means in response to activation of the fifth gate control signal;

means, during a read transfer cycle, for activating the fourth gate control signal when the second RAM section coupling means is transferring the first data in response to activation of the row address strobe signal, and for subsequently deactivating the fourth gate control signal after the first data is transferred to the third latch means; and means, during a read transfer cycle, for activating the fifth gate control signal when the third latch means is holding the first data, for subsequently deactivating the fifth gate control signal after the first data is transferred to the second latch means, and for deactivating the fifth gate control signal when data is transferred from the first RAM section to the first serial port section;

wherein the means for activating and deactivating the second sense signal includes means, during a read transfer cycle, for deactivating the second sense signal after second data is transferred from the second latch means in response to activation of the third gate control signal, and for subsequently activating the second sense signal after the first data is transferred to the second latch means in response to activation of the fifth gate control signal; and wherein the means for activating and deactivating the second gate control signal includes means for deactivating the second gate control signal when data is transferred from the second RAM section to the first serial port section.

5. A circuit in accordance with claim 3, which transfers data from a second RAM section to the first serial port section during a read transfer cycle in response to activation of a row address strobe signal, and further comprising:

third latch means, coupled to the third gate means, for holding data in response to activation of a third sense signal;

second RAM section coupling means, coupled to the second RAM section, fir transferring data to and from the second RAM section; and fourth gate means, coupled between the second RAM section coupling means and the third latch means, for transferring data between the second RAM section coupling means and the third latch means in response to activation of a fourth gate control signal, wherein the fourth gate means is rendered conductive at times when the fourth gate control signal is activated and is rendered nonconductive at times when the fourth gate control signal is not activated;

wherein the third gate means includes means for transferring data between the third latch means and the second latch means in response to activation of a fifth gate control signal, wherein the third gate means is rendered conductive at times when the fifth gate control signal is activated and is rendered nonconductive at times when the fifth gate control signal is not activated; and wherein the control means is coupled to the third latch means and to the third and fourth gate means, and is responsive to activation of the row address strobe signal, for activating and deactivating the third sense signal and the fourth and fifth gate control signals, and wherein the control means further includes:

means, during a read transfer cycle, for activating the third sense signal after first data is transferred to the third latch means in response to activation of the fourth gate control signal, and for subsequently deactivating the third sense signal after the first data is transferred from the third latch means in response to activation of the fifth gate control signal;

means, during a read transfer cycle, for activating the fourth gate control signal when the second RAM section coupling means is transferring the first data in response to activation of the row address strobe signal, and for subsequently deactivating the fourth gate control signal after the first data is transferred to the third latch means; and means, during a read transfer cycle, for activating the fifth gate control signal when the third latch means is holding the first data, for subsequently deactivating the fifth gate control signal after the first data is transferred to the second latch means, and for deactivating the fifth gate control signal when data is transferred from the first RAM section to the first serial port section;

wherein the means for activating and deactivating the second sense signal includes means, during a read transfer cycle, for deactivating the second sense signal after second data is transferred from the second latch means in response to activation of the third gate control signal, and for subsequently activating the second sense signal after the first data is transferred to the second latch means in response to activation of the fifth gate control signal; and wherein the means for activating and deactivating the second gate control signal includes means for deactivating the second gate control signal when data is transferred from the second RAM section to the first serial port section.

6. A circuit in accordance with claim 5, which transfers data between the first RAM section and the second RAM section in response to activation of the row address strobe signal, and in which the control means further comprises:

means, during a transfer from the first to the second RAM section, for activating a sixth gate control signal when the first RAM section coupling means is transferring the first data in response to activation of the row address strobe signal, and for subsequently deactivating the sixth gate control signal after the first data is transferred to the second latch means;

means, during a transfer from the first to the second RAM section, for activating a seventh gate control signal when the second latch means is holding the first data, and for subsequently deactivating the seventh gate control signal after the first data is transferred to the second RAM section coupling means;

means, during a transfer from the second to the first RAM section, for activating the seventh gate control signal when the second RAM section coupling means is transferring the first data in response to activation of the row address strobe signal, and for subsequently deactivating the seventh gate control signal after the first data is transferred to the second latch means; and means, during a transfer from the second to the first RAM section, for activating the sixth gate control signal when the second latch means is holding the first data, and for subsequently deactivating the sixth gate control signal after the first data is transferred to the first RAM section coupling means;

wherein the first gate means includes means, during a transfer between the first and the second RAM section, for transferring data in response to activation of the first and the sixth gate control signals;

wherein the second gate means includes means, during a transfer between the first and the second RAM section, for transferring data in response to activation of the second and the sixth gate control signals;

wherein the third gate means includes means, during a transfer between the first and the second RAM section, for transferring data between the second and third latch means in response to activation of the fifth and the seventh gate control signals; and wherein the fourth gate means includes means, during a transfer between the first and the second RAM section, for transferring data in response to activation of the fourth and the seventh gate control signals.

7. A circuit in accordance with claim 5, which transfers data from the first serial port section to the second RAM section during a write transfer cycle in response to activation of the row address strobe signal, and in which the control means further comprises:

means, during a write transfer cycle, for activating the third sense signal after write data is transferred to the third latch means in response to activation of the fifth gate control signal, and for subsequently deactivating the third sense signal after the write data is transferred from the third latch means in response to activation of the fourth gate control signal;

means, during a write transfer cycle, for activating the fourth gate control signal when the third latch means is holding the write data, and for subsequently deactivating the fourth gate control signal after the write data is transferred to the second RAM section coupling means; and means, during a write transfer cycle, for activating the fifth gate control signal in response to activation of the row address strobe signal when the second latch means is holding the write data, for subsequently deactivating the fifth gate control signal after the write data is transferred to the third latch means, and for deactivating the fifth gate control signal when data is transferred from the first serial port section to the first RAM section; and wherein the means for activating and deactivating the second gate control signal includes means for deactivating the second gate control signal when data is transferred from the first serial port section to the second RAM section.

8. A circuit in accordance with claim 7, which transfers data between the first RAM section and the second RAM section in response to activation of the row address strobe signal, and in which the control means further comprises:

means, during a transfer from the first to the second RAM section, for activating a sixth gate control signal when the first RAM section coupling means is transferring the first data in response to activation of the row address strobe signal, and for subsequently deactivating the sixth gate control signal after the first data is transferred to the second latch means;

means, during a transfer from the first to the second RAM section, for activating a seventh gate control signal when the second latch means is holding the first data, and for subsequently deactivating the seventh gate control signal after the first data is transferred to the second RAM section coupling means;

means, during a transfer from the second to the first RAM section, for activating the seventh gate control signal when the second RAM section coupling means is transferring the first data in response to activation of the row address strobe signal, and for subsequently deactivating the seventh gate control signal after the first data is transferred to the second latch means; and means, during a transfer from the second to the first RAM section, for activating the sixth gate control signal when the second latch means is holding the first data, and for subsequently deactivating the sixth gate control signal after the first data is transferred to the first RAM section coupling means;

wherein the first gate means includes means, during a transfer between the first and the second RAM section, for transferring data in response to activation of the first and the sixth gate control signals;

wherein the second gate means includes means, during a transfer between the first and the second RAM section, for transferring data in response to activation of the second and the sixth gate control signals;

wherein the third gate means includes means, during a transfer between the first and the second RAM section, for transferring data between the second and third latch means in response to activation of the fifth and the seventh gate control signals; and wherein the fourth gate means includes means, during a transfer between the first and the second RAM section, for transferring data in response to activation of the fourth and the seventh gate control signals.

9. A circuit in accordance with claim 3, which transfers data from the first RAM section or a second RAM section to a second serial port section or the first serial port section, respectively, in response to activation of the row address strobe signal, and further comprising:

second RAM section coupling means, coupled to the second RAM section, for transferring data to and from the second RAM section;

second serial port section coupling means, coupled to the second serial port section, for transferring data to and from the second serial port section;

second RAM gate means, coupled between the second RAM section coupling means and the second latch means, for transferring data between the second RAM section coupling means and the second latch means in response to activation of a second RAM gate control signal, wherein the second RAM gate means is rendered conductive at times when the second RAM gate control signal is activated and is rendered nonconductive at times when the second RAM gate control signal is non activated; and second serial gate means, coupled between the second serial port section coupling means and the first latch means, for transferring data between the second serial port section coupling means and the first latch means in response to activation of a second serial gate control signal, wherein the second serial gate means is rendered conductive at times when the second serial gate control signal is activated and is rendered nonconductive at times when the second serial gate control signal is not activated; and wherein the control means is coupled to the second RAM gate means and to the second serial gate means, and is responsive to activation of the row address strobe signal, for activating and deactivating the second RAM gate control signal and the second serial gate control signal, and wherein the control means further includes:

means, during a read transfer cycle for a transfer from the second RAM section to the second serial port section, for activating the second RAM gate control signal when the second RAM section coupling means is transferring the first data in response to activation of the row address strobe signal, and for subsequently deactivating the second RAM gate control signal after the first data is transferred to the second latch means; and means, during a read transfer cycle for a transfer from the second RAM section to the second serial port section, for activating the second serial gate control signal when the first latch means is holding the first data, and for subsequently deactivating the second serial gate control signal after the first data is transferred to the second serial port section coupling means;

wherein the means for activating and deactivating the first sense signal includes means, during a read transfer cycle for a transfer from the second RAM section to the second serial port section, for deactivating the first sense signal after second data is transferred from the first latch means in response to activation of the second serial gate control signal, and for subsequently activating the first sense signal after the first data is transferred to the first latch means in response to activation of the second gate control signal;

wherein the means for activating and deactivating the second sense signal includes means, during a read transfer cycle for a transfer from the second RAM section to the second serial port section, for activating the second sense signal after the first data is transferred to the second latch means in response to activation of the second RAM gate control signal, and for subsequently deactivating the second sense signal after the first data is transferred from the second latch means in response to activation of the second gate control signal; and wherein the means for activating and deactivating the second gate signal includes means, during a read transfer cycle for a transfer from the second RAM section to the second serial port section, for activating the second gate control signal when the second latch means is holding the first data, and for subsequently deactivating the second gate control signal after the first data is transferred to the first latch means.

10. A circuit in accordance with claim 9, which transfers data from the second serial port section to the second RAM section during a write transfer cycle in response to activation of the row address strobe signal, and in which the control means further comprises:

means, during a write transfer cycle for a transfer from the second serial port section to the second RAM section, for activating the second sense signal after write data is transferred to the second latch means in response to activation of the second gate control signal, and for subsequently deactivating the second sense signal after the write data is transferred from the second latch means in response to activation of the second RAM gate control signal;

means, during a write transfer cycle for a transfer from the second serial port section to the second RAM section, for activating the first sense signal;

means, during a write transfer cycle for a transfer from the second serial port section to the second RAM section, for activating the second RAM gate control signal when the second latch means is holding the write data, and for subsequently deactivating the second RAM gate control signal after the write data is transferred to the second RAM section coupling means;

means, during a write transfer cycle for a transfer from the second serial port section to the second RAM section, for activating the second gate control signal in response to activation of the row address strobe signal when the first latch means is holding the write data, and for subsequently deactivating the second gate control signal after the write data is transferred to the second latch means; and means, during a write transfer cycle for a transfer from the second serial port section to the second RAM section, for activating the second serial gate control signal when the second serial port section coupling means is transferring the write data, and for subsequently deactivating the second serial gate control signal after the write data is transferred to the first latch means.

11. A circuit in accordance with claim 4, which transfers data between the first RAM section and the second RAM section in response to activation of the row address strobe signal, and in which the control means further comprises:

means, during a transfer from the first to the second RAM section, for activating a sixth gate control signal when the first RAM section coupling means is transferring the first data in response to activation of the row address strobe signal, and for subsequently deactivating the sixth gate control signal after the first data is transferred to the second latch means;

means, during a transfer from the first to the second RAM section, for activating a seventh gate control signal when the second latch means is holding the first data, and for subsequently deactivating the seventh gate control signal after the first data is transferred to the second RAM section coupling means;

means, during a transfer from the second to the first RAM section, for activating the seventh gate control signal when the second RAM section coupling means is transferring the first data in response to activation of the row address strobe signal, and for subsequently deactivating the seventh gate control signal after the first data is transferred to the second latch means; and means, during a transfer from the second to the first RAM section, for activating the sixth gate control signal when the second latch means is holding the first data, and for subsequently deactivating the sixth gate control signal after the first data is transferred to the first RAM section coupling means;

wherein the first gate means includes means, during a transfer between the first and the second RAM section, for transferring data in response to activation of the first and the sixth gate control signals;

wherein the second gate means includes means, during a transfer between the first and the second RAM section, for transferring data in response to activation of the second and the sixth gate control signals;

wherein the third gate means includes means, during a transfer between the first and the second RAM section, for transferring data between the second and third latch means in response to activation of the fifth and the seventh gate control signals; and wherein the fourth gate means includes means, during a transfer between the first and the second RAM section, for transferring data in response to activation of the fourth and the seventh gate control signals.

12. A circuit in accordance with claim 4, which transfers data from the first serial port section to the second RAM section during a write transfer cycle in response to activation of the row address strobe signal, and in which the control means further comprises:

means, during a write transfer cycle, for activating the third sense signal after write data is transferred to the third latch means in response to activation of the fifth gate control signal, and for subsequently deactivating the third sense signal after the write data is transferred from the third latch means in response to activation of the fourth gate control signal;

means, during a write transfer cycle, for activating the fourth gate control signal when the third latch means is holding the write data, and for subsequently deactivating the fourth gate control signal after the write data is transferred to the second RAM section coupling means; and means, during a write transfer cycle, for activating the fifth gate control signal in response to activation of the row address strobe signal when the second latch means is holding the write data, for subsequently deactivating the fifth gate control signal after the write data is transferred to the third latch means, and for deactivating the fifth gate control signal when data is transferred from the first serial port section to the first RAM section; and wherein the means for activating and deactivating the second gate control signal includes means for deactivating the second gate control signal when data is transferred from the first serial port section to the second RAM section.

13. A circuit in accordance with claim 12, which transfers data between the first RAM section and the second RAM section in response to activation of the row address strobe signal, and in which the control means further comprises:

means, during a transfer from the first to the second RAM section, for activating a sixth gate control signal when the first RAM section coupling means is transferring the first data in response to activation of the row address strobe signal, and for subsequently deactivating the sixth gate control signal after the first data is transferred to the second latch means;

means, during a transfer from the first to the second RAM section, for activating a seventh gate control signal when the second latch means is holding the first data, and for subsequently deactivating the seventh gate control signal after the first data is transferred to the second RAM section coupling means;

means, during a transfer from the second to the first RAM section, for activating the seventh gate control signal when the second RAM section coupling means is transferring the first data in response to activation of the row address strobe signal, and for subsequently deactivating the seventh gate control signal after the first data is transferred to the second latch means; and means, during a transfer from the second to the first RAM section, for activating the sixth gate control signal when the second latch means is holding the first data, and for subsequently deactivating the sixth gate control signal after the first data is transferred to the first RAM section coupling means;

wherein the first gate means includes means, during a transfer between the first and the second RAM section, for transferring data in response to activation of the first and the sixth gate control signals;

wherein the second gate means includes means, during a transfer between the first and the second RAM section, for transferring data in response to activation of the second and the sixth gate control signals;

wherein the third gate means includes means, during a transfer between the first and the second RAM section, for transferring data between the second and third latch means in response to activation of the fifth and the seventh gate control signals; and wherein the fourth gate means includes means, during a transfer between the first and the second RAM section, for transferring data in response to activation of the fourth and the seventh gate control signals.

* * * * *